United States Patent
Monreal et al.

(10) Patent No.: US 10,078,117 B2
(45) Date of Patent: Sep. 18, 2018

(54) MAGNETIC FIELD SENSORS AND METHODS USING MIXING IN A MAGNETORESISTANCE ELEMENT

(71) Applicant: Allegro MicroSystems, LLC, Worcester, MA (US)

(72) Inventors: Gerardo A. Monreal, Buenos Aires (AR); Andreas P. Friedrich, Metz-Tessy (FR); Claude Fermon, Orsay (FR); Myriam Pannetier-Lecoeur, Bures sur Yvette (FR)

(73) Assignees: Allegro MicroSystems, LLC, Manchester, NH (US); Commissariat à l'énergie atomique et aux énergies alternatives, Paris (FR)

( * ) Notice: Subject to any disclaimer, the term of this patent is extended or adjusted under 35 U.S.C. 154(b) by 392 days.

(21) Appl. No.: 14/870,834

(22) Filed: Sep. 30, 2015

(65) Prior Publication Data
US 2017/0089987 A1    Mar. 30, 2017

(51) Int. Cl.
| | | |
|---|---|---|
| G01B 7/00 | (2006.01) | |
| G01N 27/82 | (2006.01) | |
| G01R 33/00 | (2006.01) | |
| G01R 33/09 | (2006.01) | |

(52) U.S. Cl.
CPC ......... G01R 33/0023 (2013.01); G01R 33/09 (2013.01); G01R 33/093 (2013.01)

(58) Field of Classification Search
CPC ... G01R 33/0023; G01R 33/093; G01R 33/09
USPC .................................................. 324/240, 252
See application file for complete search history.

(56) References Cited

U.S. PATENT DOCUMENTS

| | | | |
|---|---|---|---|
| 2009/0206831 A1 | 8/2009 | Fermon et al. | |
| 2013/0057257 A1* | 3/2013 | Friedrich | G01R 33/077 324/207.2 |

FOREIGN PATENT DOCUMENTS

| | | | |
|---|---|---|---|
| JP | 2000055998 | * | 5/1998 |
| JP | 2000 055998 A | | 2/2000 |
| WO | WO 2007/095971 A1 | | 8/2007 |
| WO | WO 2015/058733 A1 | | 4/2015 |

OTHER PUBLICATIONS

PCT Search Report and Written Opinion dated Dec. 8, 2016 related to U.S. Appl. No. 2016/052745; 15 pages.

* cited by examiner

*Primary Examiner* — Farhana Hoque
(74) *Attorney, Agent, or Firm* — Daly, Crowley, Mofford & Durkee, LLP

(57) ABSTRACT

A magnetic field sensor and an associated method use one or more magnetoresistance elements driven with an AC mixing current and experiencing an AC mixing magnetic field to generate a DC voltage signal or a DC voltage signal component related to a slope of a transfer curve of the one or more magnetoresistance elements.

19 Claims, 16 Drawing Sheets

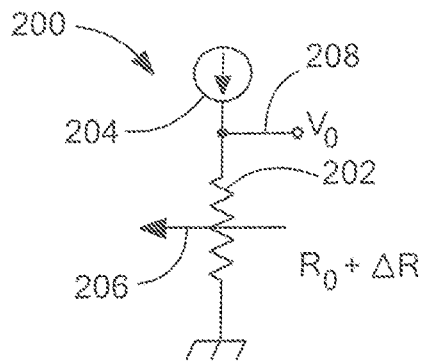
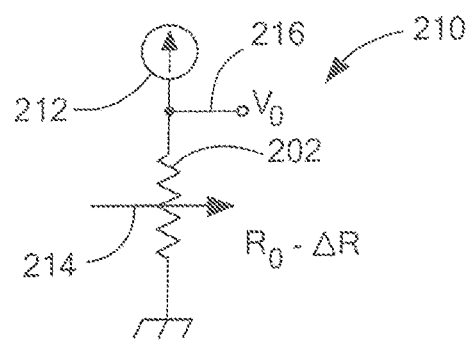
*FIG. 2*  *FIG. 2A*
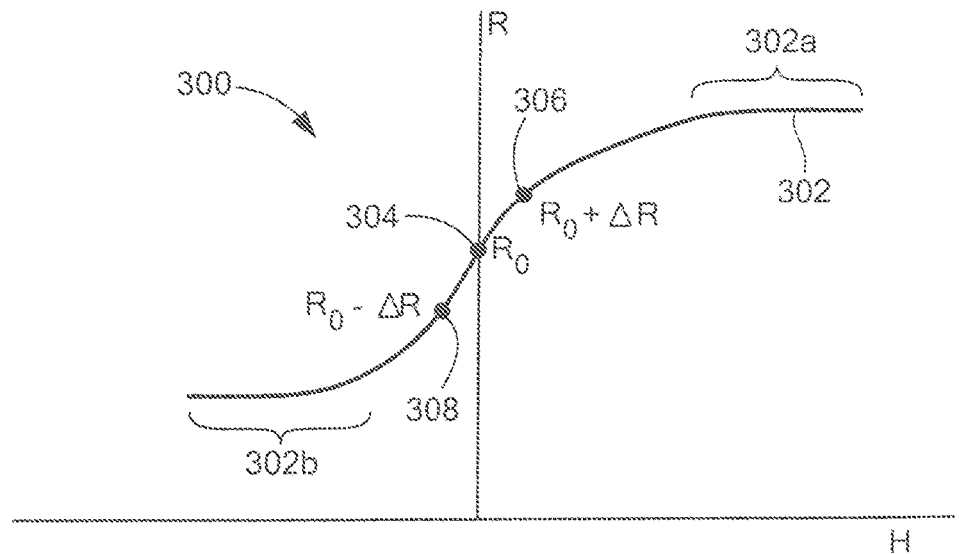
*FIG. 3*

MAGNETIC FIELD SENSORS AND METHODS USING MIXING IN A MAGNETORESISTANCE ELEMENT

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetoresistance elements, and, more particularly, to magnetic field sensors and methods that use mixing (or modulation) in a magnetoresistance element.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

As is known, metal based or metallic magnetoresistance elements (e.g., GMR, TMR, AMR) tend to have axes of sensitivity parallel to a substrate on which they are formed.

As used herein, the term "magnetic field sensor" is used to describe a circuit that uses a magnetic field sensing element, generally in combination with other circuits. In a typical magnetic field sensor, the magnetic field sensing element and the other circuits can be integrated upon a common substrate.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

GMR and TMR elements are known to have a relatively high sensitivity, compared, for example, to Hall elements. GMR and TMR elements are also known to have moderately good linearity, but over a restricted range of magnetic fields, more restricted in range than a range over which a Hall element can operate.

The magnetoresistance element may be a single element or, alternatively, two or more magnetoresistance elements may be arranged in various configurations, e.g., a half bridge or full (Wheatstone) bridge.

When arranged in a half bridge, usually one magnetoresistance element is used in series combination with one fixed resistor. If instead, two identical magnetoresistance elements were used, the half bridge would tend to have no output signal, since both magnetoresistance elements would tend to change resistance in the same direction in response to a magnetic field.

When arranged in a full bridge, usually two magnetoresistance elements are used in two series combinations with two fixed resistors. If instead, four identical magnetoresistance elements were used, the full bridge would tend to have no output signal, since the four magnetoresistance elements would tend to change resistance in the same direction in response to a magnetic field.

The above-described bridges that use fixed resistors in various arrangements have disadvantages. For example, the fixed resistors can have temperature coefficients that do not match the temperature coefficients of the magnetoresistance elements, and therefore, an output signal generated by the bridges may vary with respect to temperature.

Even a single magnetoresistance element driven from a current source (high output impedance) has a temperature coefficient that results in an output signal generated by the single magnetoresistance element that may vary with respect to temperature.

It would be desirable to provide a magnetoresistance element, half bridge, or full bridge, an output signal from which varies less with temperature. It would be desirable to provide a magnetic field sensor that uses the above described magnetoresistance element, half bridge, or full bridge.

SUMMARY

The present invention provides a magnetoresistance element, half bridge, or full bridge, an output signal from which varies less with temperature. The present invention also provides a magnetic field sensor that uses the above described magnetoresistance element, half bridge, or full bridge.

In accordance with an example useful for understanding an aspect of the present invention, a magnetic field sensor for sensing a sensed external magnetic field can include first, second, third, and fourth magnetoresistance elements arranged in a bridge, a first junction node coupling the first and second magnetoresistance elements in series and a second junction node coupling the third and fourth magnetoresistance elements in series, wherein the bridge generates a bridge output signal between the first and second junction nodes. The magnetic field sensor can further include at least one current generating circuit operable to generate first and second AC mixing currents, wherein the first AC mixing current is coupled to pass through the first and second series coupled magnetoresistance elements, wherein the second AC mixing current is coupled to pass through the third and fourth series coupled magnetoresistance elements, wherein the first and second AC mixing currents have first and second AC current components, respectively, with respective first and second AC current frequencies, which are the same frequency or which are different frequencies. The magnetic field sensor can further include at least one magnetic field generating circuit operable to generate first, second, third, and fourth AC mixing magnetic fields proximate to the first, second, third, and fourth magnetoresistance elements, respectively, wherein the first, second, third, and fourth AC mixing magnetic fields have first, second, third and fourth AC magnetic field components, respectively, wherein the first and second AC magnetic field components have a first AC magnetic field frequency the same as the first AC current frequency, wherein the third and fourth AC magnetic field components have a second AC magnetic field frequency the same frequency as the second AC current frequency, wherein the first, second, third, and fourth AC mixing magnetic fields result in the bridge output signal comprising a first DC component that changes value in response to changes of the sensed external magnetic field.

In accordance with an example useful for understanding another aspect of the present invention, a method of sensing a sensed external magnetic field can include providing first, second, third, and fourth magnetoresistance elements arranged in a bridge, a first junction node coupling the first and second magnetoresistance elements in series and a second junction node coupling the third and fourth magnetoresistance elements in series, wherein the bridge generates a bridge output signal between the first and second junction nodes. The method can further include generating first and second AC mixing currents, wherein the first AC mixing current is coupled to pass through the first and second series coupled magnetoresistance elements, wherein the second AC mixing current is coupled to pass through the third and fourth series coupled magnetoresistance elements, wherein the first and second AC mixing currents have first and second AC current components, respectively, with respective first and second AC current frequencies, which are the same frequency or which are different frequencies. The method can further include generating first, second, third, and fourth AC mixing magnetic fields proximate to the first, second, third, and fourth magnetoresistance elements, respectively, wherein the first, second, third, and fourth AC mixing magnetic fields have first, second, third and fourth AC magnetic field components, respectively, wherein the first and second AC magnetic field components have a first AC magnetic field frequency the same as the first AC current frequency, wherein the third and fourth AC magnetic field components have a second AC magnetic field frequency the same as the second AC current frequency, wherein the first, second, third, and fourth AC mixing magnetic fields result in the bridge output signal comprising a first DC component that changes value in response to changes of the sensed external magnetic field.

In accordance with an example useful for understanding another aspect of the present invention, a magnetic field sensor for sensing a sensed external magnetic field can include a first magnetoresistance element having a first node and a second node. The magnetic field sensor can further include at least one current generating circuit operable to generate an AC mixing current, wherein the AC mixing current is coupled to pass through the first magnetoresistance element, wherein the AC mixing current has an AC current component with an AC current frequency. The magnetic field sensor can further include at least one magnetic field generating circuit operable to generate a first AC mixing magnetic field proximate to the first magnetoresistance element, wherein the first AC mixing magnetic field has a first AC magnetic field component with an AC magnetic field frequency the same as the AC current frequency, wherein the first AC mixing magnetic field results in an output signal appearing at the first node or the second node of the first magnetoresistance element, wherein the output signal comprises a DC component that changes value in response to changes of the sensed external magnetic field.

In accordance with an example useful for understanding another aspect of the present invention, a method of sensing a sensed external magnetic field can include providing a first magnetoresistance element having a first node and a second node. The method can further include generating an AC mixing current, wherein the AC mixing current is coupled to pass through the first magnetoresistance element, wherein the AC mixing current has an AC current component with an AC current frequency. The method can further include generating a first AC mixing magnetic field proximate to the first magnetoresistance element, wherein the first AC mixing magnetic field has an AC magnetic field component with an AC magnetic field frequency the same as the AC current frequency, wherein the first AC mixing magnetic field results in an output signal appearing at the first node or the second node of the first magnetoresistance element, wherein the output signal comprises a DC component.

BRIEF DESCRIPTION OF THE DRAWINGS

The foregoing features of the invention, as well as the invention itself may be more fully understood from the following detailed description of the drawings, in which:

FIGS. 2 and 2A are block diagrams of a magnetoresistance element driven by a current source in two different directions;

FIG. 3 is a graph showing output values from the magnetoresistance element of FIGS. 2 and 2A when driven with currents in the two different directions and when in the presence of a zero sensed external magnetic field;

DETAILED DESCRIPTION

Figure 1:
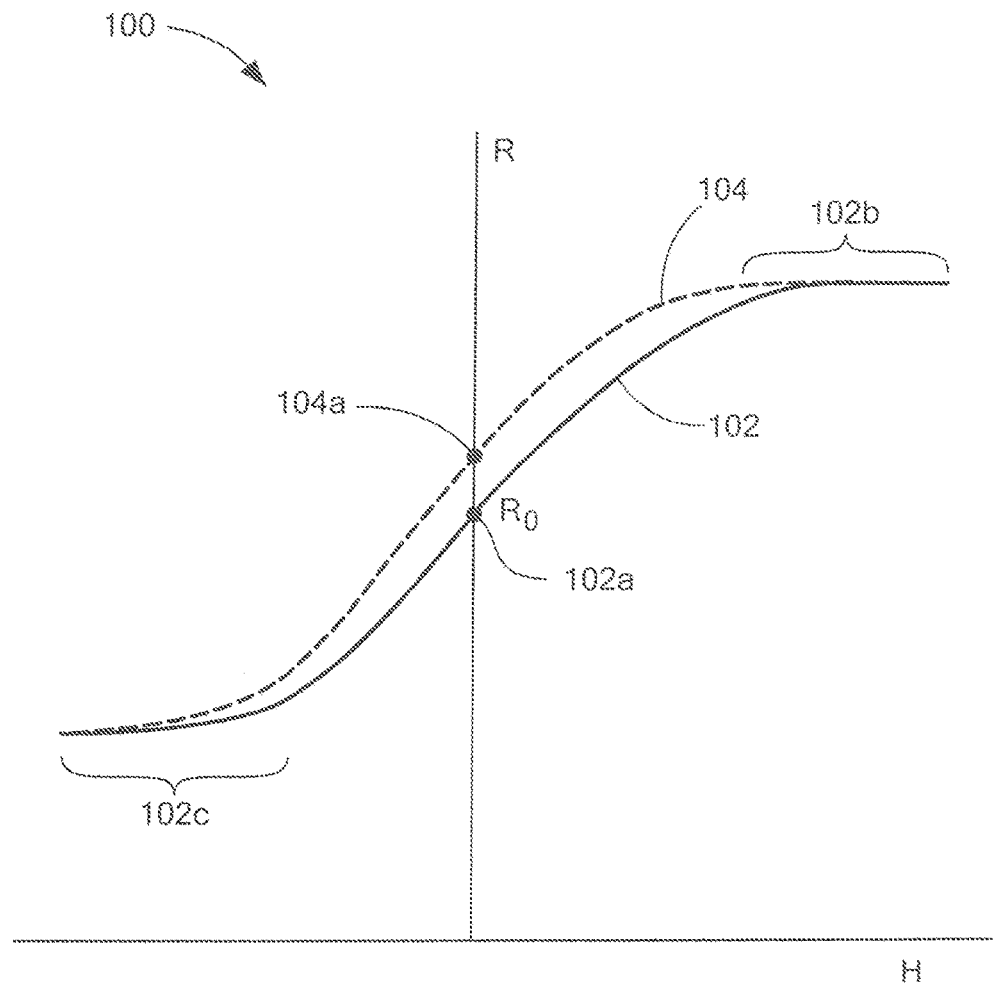
FIG. 1 is a graph showing a transfer function of a GMR magnetoresistance element in spin valve configuration.

As used herein, the term "magnetic field sensing element" is used to describe a variety of electronic elements that can sense a magnetic field. A magnetoresistance element is but one type of magnetic field sensing elements.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet, and a magnetic field sensor that senses a magnetic field density of a magnetic field.

As used herein, the term "self-generated AC mixing magnetic field" is used to describe an AC magnetic field generated proximate to a magnetoresistance element by an "AC mixing current" passing through the magnetoresistance element. The term "mixing" is used to refer to a multiplying (or modulating) effect described more fully below that multiplies the self-generated AC mixing magnetic field with the AC mixing current.

As used herein, the term "externally-generated AC mixing magnetic field" is used to describe an AC magnetic field generated proximate to a magnetoresistance element by other means, for example, by an AC current in a coil. The externally-generated AC mixing magnetic field can also mix with the AC mixing current passing through the magnetoresistance element.

As used herein, the term "AC mixing magnetic field" is used to describe either a self-generated AC mixing magnetic field or an externally-generated AC mixing magnetic field"

In contrast to the above, as used herein, the term "sensed external magnetic field" is used to describe a magnetic field that is sensed, but that is not used in the mixing process, i.e., that is not an AC mixing magnetic field. The sensed external magnetic field can be at DC or at some frequency other than the frequency of the AC mixing magnetic field. In general, it is desirable that the frequency of the AC mixing magnetic field (and also of the AC mixing current), used in the mixing process, is higher in frequency than a frequency of the sensed external magnetic field.

As used herein, the term "current generating circuit" is used to describe a circuit having either a current source or a voltage source, or both, which can generate a current.

Structures and methods described herein apply to all forms of magnetoresistance elements.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe and electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

Referring to FIG. 1, graph 100 has a horizontal axis with a scale in units of magnetic field in arbitrary units. The graph 100 also has a vertical axis with a scale in units of resistance in arbitrary units.

A curve 102 is representative of a resistance versus magnetic field transfer function of a magnetoresistance element at a nominal temperature. The curve 102 intersects the vertical axis at a point 102a, Ro, which is representative of a nominal resistance of the magnetoresistance element when the magnetoresistance element experiences a zero magnetic field.

The curve 104 is representative of a resistance versus magnetic field transfer function of the same magnetoresistance element but at a different temperature. The curve 104 intersects the vertical axis at a 104a, which is representative of a different resistance of the magnetoresistance element at the different temperature when the magnetoresistance element experiences a zero magnetic field.

The transfer curve 102 has an upper saturation region 102b and a lower saturation region 102c, within which resistance of the magnetoresistance element does not change very much with respect to magnetic field. The transfer curve also has a linear region between the two saturation regions 102b, 102c.

The shape of the transfer curve 102, and, in particular, resistances at the saturation regions 102b, 102c, depends on type of and construction details of the magnetoresistance elements. However, the sensed external magnetic field at which the magnetoresistance element saturates (i.e., the bend points of the transfer function 102) is largely independent of temperature, and thus, does not tend to drift.

The sensed external magnetic field for a GMR of a TMR magnetoresistance element at saturation can be adjusted with various design parameters. For a GMR magnetoresistance element that has a C or yoke shape, the sensed external magnetic field at which saturation begins can be determined in-part by way of a width of the GMR magnetoresistance element and also by way of a thickness of a free layer used in the layer stack of the GMR magnetoresistance element. Additionally, for a GMR magnetoresistance element, crystalline anisotropy induced by deposition details can in-part determine the saturation point. Also, double pinned arrangements can in-part determine the saturation point by setting an amount of partial coupling between a second pinning layer and a free layer.

A magnetoresistance element has a directional maximum response axis. When the magnetoresistance element experiences a magnetic field in a direction of the maximum response axis, the resistance of the magnetoresistance element moves to the right on the transfer curve 102, e.g., to a higher resistance. When the magnetoresistance element experiences a magnetic field in a direction opposite to the maximum response axis, the resistance of the magnetoresistance element moves to the left on the transfer curve 102, e.g., to a lower resistance.

Circuits and techniques described below can determine a slope of the curve 102 at whatever magnetic fields the magnetoresistance element experiences. It will be apparent that the slope is relatively high at or near zero magnetic field, i.e., near the point 102a. It will also be apparent that the slope is relatively low in the saturation regions 102b, 102c.

Determination of slope results from a mixing behavior of a magnetoresistance element, i.e., mixing an AC mixing magnetic field with frequency f1 with an AC mixing current drive signal applied to the magnetoresistance element with a frequency f2. Mixing of magnetoresistance elements is described in published PCT application WO 2007/095971 and in U.S. Published Application 2009/0206831, published Aug. 20, 2009, both of which are incorporated by reference herein in their entirety.

As is known, in general, mixing of frequencies (i.e., multiplying of signals) results in signal frequency components at the sum and at the difference of the mixed frequencies. For the specific case where f1=f2=f, the difference of the mixed frequencies (f−f) results in a signal component at DC.

For a cosine AC mixing current driving the magnetoresistance element at frequency, f, and a cosine AC mixing magnetic field with frequency, ft at the magnetoresistance element, a resulting voltage appearing on the magnetoresistance element is:

$$V = RI \quad (1)$$

$$= Ro[1 + H\cos(2\pi ft)] * Io\cos(2\pi ft)$$

$$= RoIo[\alpha H/2 + \cos t(2\pi ft) + (\alpha H/2)\cos(4\pi ft)] \quad (2)$$

where:
f=frequency;
t=time;
Ro=nominal resistance with no AC mixing magnetic field (either with or without a sensed external magnetic field);
Io=magnitude of applied AC mixing current;
H=magnitude of AC mixing magnetic field; and
α=slope of the transfer curve 102 in the vicinity of a center operating point when experiencing the AC mixing magnetic field (either with or without a sensed external magnetic field)

The above equation (2) has a DC term:

$$Vdc=RoIo[\alpha H/2] \quad (3)$$

The DC term is proportional to the slope a of the transfer curve.

While the above provides an explanation of the mixing effect in the frequency domain, examples below describe the same mixing effect but in the time domain. Time waveforms are provided in figures below.

While sinusoidal AC mixing currents and sinusoidal AC mixing magnetic fields are described above, examples below use square wave signals. It is known that a square wave signal at frequency, f, includes frequency components (sinusoids) at the frequency, f, and at odd harmonics thereof.

While square wave signals are used in examples below, it should be appreciated that AC mixing currents and/or AC mixing magnetic fields used in the mixing process can be sinusoids.

Circuits in FIGS. 2 and 2A, 5 and 5A, 6 and 6A, 7 and 7A, and 8 and 8A are first described below in static terms, with DC (static) drive currents and with DC (static) magnetic fields. However, it is also described below that the circuits in FIGS. 2 and 2A, 5 and 5A, 6 and 6A, 7 and 7A, and 8 and 8A can be alternated, in which case, the drive currents and the magnetic fields are AC alternating signals, and mixing occurs.

Referring now to FIG. 2, a circuit 200 includes a magnetoresistance element 202 driven with a static drive current generated by a current source 204. Under these conditions, the magnetoresistance element 202 experiences a static magnetic field in a direction 206 generated by current from the current source 204.

The magnetoresistance element 202 does not experience a zero magnetic field, and therefore, does not have the nominal resistance, Ro, indicated in FIG. 1. Instead, the resistance of the magnetoresistance element 202 can be Ro+ΔR. A static output voltage 208 from the circuit 200 is:

$$Vo=I(Ro+\Delta R), \quad (4)$$

where I is the static current generated by the current source 204.

Referring now to FIG. 2A, in which like elements of FIG. 2 are shown having like reference designations, a circuit 210 is similar to the circuit 200 of FIG. 2, but includes a current source 212 generating a static drive current in a direction opposite from the current source 204. Under these conditions, the magnetoresistance element 202 experiences a static magnetic field in a direction 206 generated by the drive current from the current source 212. The direction 214 is opposite from the direction 206 of FIG. 2.

Accordingly, the magnetoresistance element 202 again does not experience a zero magnetic field and does not have the nominal resistance, Ro, indicated in FIG. 1. Instead, the resistance of the magnetoresistance element 202 can be Ro−ΔR. An output voltage 208 from the circuit 210 is:

$$Vo = -I(Ro-\Delta R), \quad (5)$$

where I is the static current generated by the current source 212.

For FIGS. 3 and 4 below, the circuits 200, 210 are considered to be the same circuit and the current sources 204, 212 are instead considered to be one current source that switches direction of the drive current I, resulting in an AC mixing current, and therefore, also switches direction of the resulting self-generated AC mixing magnetic field.

It should be understood that, when alternated periodically in two directions, the AC drive current and the resulting self-generated AC mixing magnetic field are used in the above described mixing process.

Referring now to FIG. 3, graph 300 has a horizontal axis with a scale in units of magnetic field in arbitrary units. The graph 300 also has a vertical axis with a scale in units of resistance in arbitrary units.

A curve 302, like the curve 102 of FIG. 1, is representative of a resistance versus magnetic field transfer function of a magnetoresistance element at a nominal temperature. The curve 302 has saturation regions 302a, 302b in which the resistance changes little when the sensed external magnetic field changes.

The curve 302 intersects the vertical axis at a point 304, Ro, which is representative of a nominal resistance of the magnetoresistance element when the magnetoresistance element experiences a zero sensed external magnetic field.

Using as an example the magnetoresistance element 202 of FIGS. 2 and 2A, resistances at points 306, 308 are Ro+ΔR and Ro−ΔR, respectively.

In view of the above, it should be recognized that, merely changing the direction of the current through the magnetoresistance element 202 in two different directions causes the resistance of the magnetoresistance element to change between two values, neither one of which is indicative of the magnetoresistance element 202 experiencing a zero magnetic field.

Furthermore, by discussion below in conjunction with FIG. 4, it will become apparent that the above two voltages do not average to zero, i.e., the above described DC term of equation (3) is produced.

It should also be understood that, in addition to the self-generated AC mixing magnetic field, if a sensed external magnetic field were also introduced to the circuits 200, 210 of FIGS. 2 and 2A, then the points 306, 308 would move together to the right or to the left according to a direction of the sensed external magnetic field. The movement is further described in conjunction with FIG. 3A.

Figure 3A:
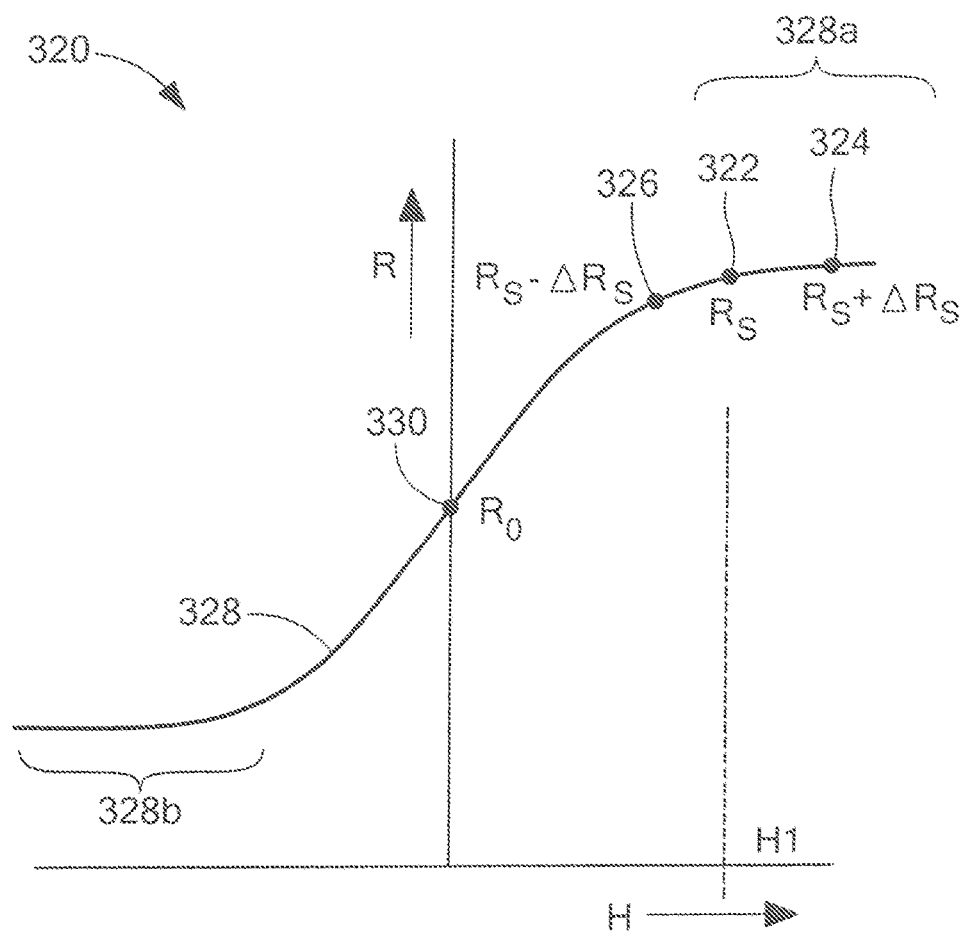
FIG. 3A is a graph showing output values from the magnetoresistance element of FIGS. 2 and 2A when driven with currents in the two different directions and when in the presence of a non-zero sensed external magnetic field.

Referring now to FIG. 3A, graph 320 has a horizontal axis with a scale in units of magnetic field in arbitrary units. The graph 320 also has a vertical axis with a scale in units of resistance in arbitrary units.

A curve 328, like the curve 102 of FIG. 1, is representative of a resistance versus magnetic field transfer function of a magnetoresistance element at a nominal temperature. The curve 328 has saturation regions 328a, 328b in which the resistance changes little when the external magnetic field changes.

The curve 328 intersects the vertical axis at a point 330, Ro, which is representative of a nominal resistance of the magnetoresistance element when the magnetoresistance element experiences a zero sensed external magnetic field.

When the magnetoresistance element experiences a sensed external magnetic field having a field of H1, the magnetoresistance element operates about a point 322, which can be in the saturation region 328a.

Again using as an example the magnetoresistance element 202 of FIGS. 2 and 2A, resistances at points 324, 326 are Rs+ΔRs and Rs−ΔRs, respectively. It will be recognized that ΔRs is substantially less that ΔR of FIG. 3. Therefore, equation like equations (4) and (5) above would yield little contribution from ΔRs, and:

$$Vo = +/-IRs \quad (6)$$

Figure 4:
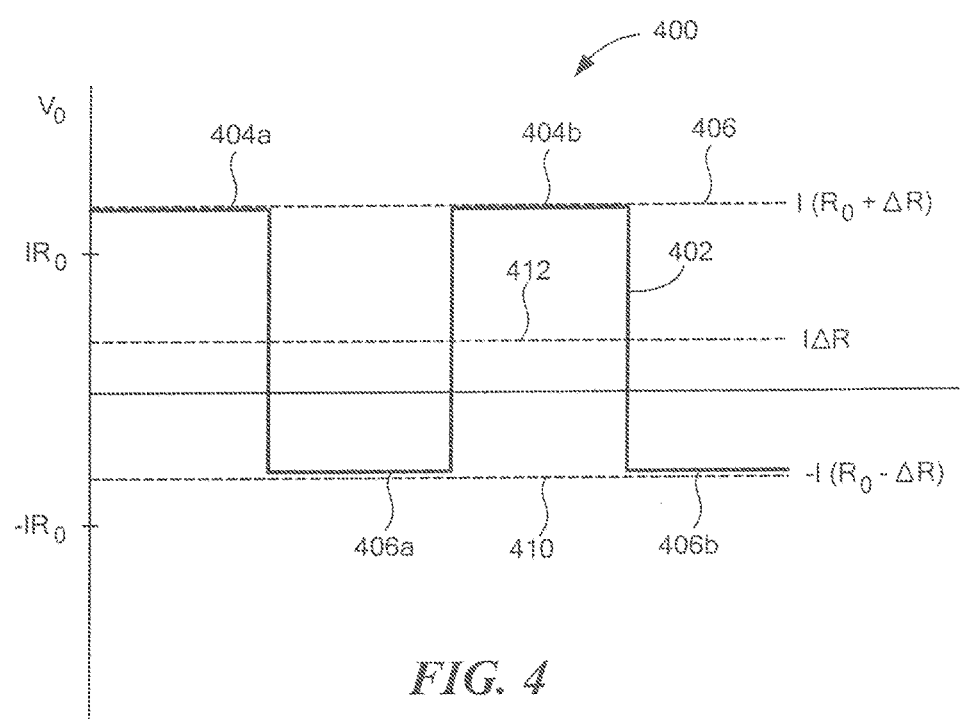
FIG. 4 is a graph showing the output values from the magnetoresistance element of FIG. 2 when driven with currents in the two different directions and when in the presence of a zero sensed external magnetic field.

Referring now to FIG. 4, a graph 400 has a horizontal axis with a scale in units of time in arbitrary units and a vertical axis with a scale in units of voltage in arbitrary units.

Referring again briefly to FIGS. 2 and 2A, if the current sources 204, 212 are the same current source and periodically switched to provide an AC mixing current to the magnetoresistance element 202, then two voltage states 408, 410 will be periodically generated individually according to equations (4) and (5) above, when the circuit(s) 200, 210 does not experience a sensed external magnetic field. A curve 402 has high states 404a, 404b and low states 406a, 406b with voltages according to equations (4) and (5), respectively.

A DC voltage 412 is indicative of an average of the two states 408, 410 and has a voltage:

$$V = I\Delta R \quad (7)$$

The DC voltage of equation (7) is generated in the presence of a zero sensed external magnetic field.

It should be apparent from the discussion above in conjunction with FIG. 3A, that when the circuit(s) of FIGS. 2 and 2A experiences a sensed external magnetic field H1, the two states are instead approximately equal, i.e., Vo=+/−IRs, and the DC voltage is approximately zero.

As discussed above in conjunction with equation (3), the DC voltage of equation (7) is indicative of a slope of the transfer function 302 of FIG. 3 in the vicinity of the points 306, 308 and is an outcome of the above-described mixing of equations (1) to (3). The points 306, 308 move to the right or to the left on the transfer curve 302 when the magnetoresistance element 302 of FIGS. 2 and 2A experiences a sensed external magnetic field. Thus, the voltage of equation (7) remains generally invariant until the points 306, 308 approach one of the saturation regions 302a, 302b due to the presence of the sensed external magnetic field of sufficient magnitude, at which point the DC voltage or DC voltage component becomes approximately zero.

Figure 5:
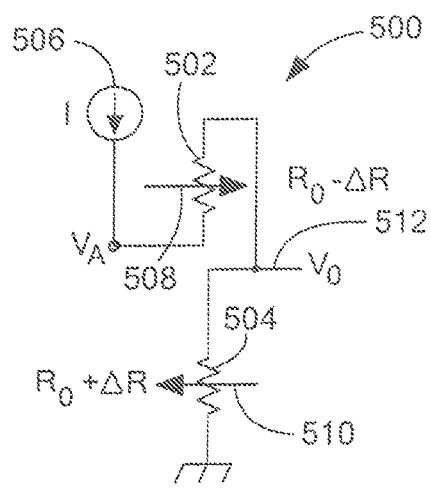
FIGS. 5 and 5A are block diagrams of two magnetoresistance elements coupled in a first half bridge series arrangement and driven by a current source in two different directions.

Referring now to FIG. 5, a circuit 500 includes a first magnetoresistance element 502 coupled in series with a second magnetoresistance element 504, driven with a static drive current generated by a current source 506. The first and second magnetoresistance elements 502, 504 are driven with the same static drive current, but flowing in opposite physical directions due to arrangement of the two magnetoresistance elements 502 504 upon a substrate.

Under these conditions, the first magnetoresistance element 502 experiences astatic magnetic field in a direction 508 generated by current from the current source 506. The second magnetoresistance element 504 experiences a static magnetic field in a direction 510 (opposite from the direction 508) generated by the current from the current source 506.

Accordingly, the first and second magnetoresistance elements 502, 504 do not experience a zero magnetic field and do not have the nominal resistance, Ro, indicated in FIG. 1. Instead, the resistance of the first magnetoresistance element 502 can be Ro−ΔR. The resistance of the second magnetoresistance element 504 can be Ro+ΔR. An output voltage 512 from the circuit 500 can be computed from:

$$VA = I[(Ro - \Delta R) + (Ro + \Delta R)] \quad (8)$$
$$= 2IRo \quad (9)$$
$$Vo = 2IRo[(Ro + \Delta R)/(2Ro)] \quad (10)$$
$$= IRo + I\Delta R \quad (11)$$

Figure 5A:
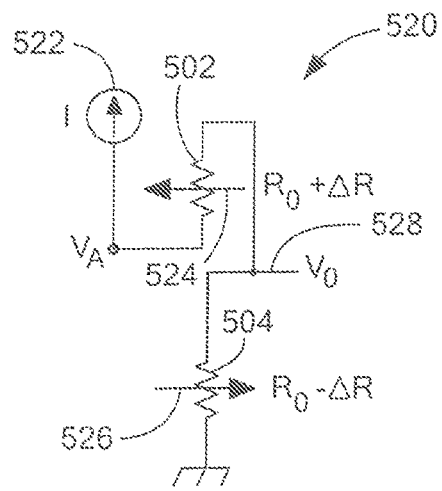

Referring now to FIG. 5A, a circuit 520 is like the circuit 500 of FIG. 5, except that a current source 522 generates a current in an opposite direction from the current generated by the current source 506 of FIG. 5.

Under these conditions, the first magnetoresistance element 502 experiences a static magnetic field in a direction 524 generated by current from the current source 522. The second magnetoresistance element 504 experiences a static magnetic field in a direction 526 (opposite from the direction 524) generated by the current from the current source 522.

Accordingly, the first and second magnetoresistance elements 502, 504 do not experience a zero magnetic field and do not have the nominal resistance, Ro, indicated in FIG. 1. Instead, the resistance of the first magnetoresistance element 502 can be Ro+ΔR. The resistance of the second magnetoresistance element 504 can be Ro−ΔR. An output voltage 528 from the circuit 520 can be computed from:

$$VA = -I[(Ro + \Delta R) + (Ro - \Delta R)] \quad (12)$$
$$= -2IRo \quad (13)$$
$$Vo = -2IRo[(Ro - \Delta R)/(2Ro)] \quad (14)$$
$$= -IRo + I\Delta R \quad (15)$$

For FIGS. 9, 9A, 9B below, the circuits 500, 520 are considered to be the same half bridge circuit and the current sources 506, 522 are instead considered to be one current source that switches direction of the drive current I, resulting in an AC mixing current, and therefore, also switches direction of the resulting magnetic field, resulting in a self-generated AC mixing magnetic field.

It should be understood that, when alternated periodically in two directions, the AC mixing current and the resulting self-generated AC mixing magnetic field provide the above described mixing.

Figure 6:
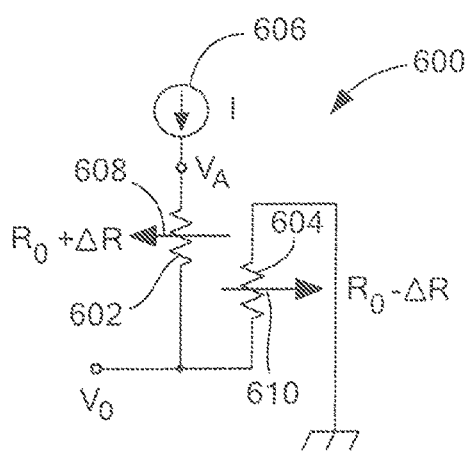
FIGS. 6 and 6A are block diagrams of two magnetoresistance elements coupled in a second different half bridge series arrangement and driven by a current source in two different directions.

Referring now to FIG. 6, a circuit 600 includes a first magnetoresistance element 602 coupled in series with a second magnetoresistance element 604, driven with a static drive current generated by a current source 606. The first and second magnetoresistance elements 602, 604 are driven with the same static drive current, but flowing in opposite physical directions due to arrangement of the two magnetoresistance elements 602 604 upon a substrate.

The first and second magneto resistance element 602, 604 are differently arranged, as shown, on a substrate than the first and second magnetoresistance elements 502, 504 of FIGS. 5 and 5A.

Under these conditions, the first magnetoresistance element 602 experiences a static magnetic field in a direction 608 generated by the current from the current source 606. The second magnetoresistance element 604 experiences a static magnetic field in a direction 610 (opposite from the direction 608) generated by the current from the current source 606.

Accordingly, the first and second magnetoresistance elements 602, 604 do not experience a zero magnetic field and do not have the nominal resistance, Ro, indicated in FIG. 1. Instead, the resistance of the first magnetoresistance element 602 can be Ro+ΔR. The resistance of the second magnetoresistance element 604 can be Ro−ΔR. An output voltage 612 from the circuit 600 can be computed from:

$$VA = I[(Ro + \Delta R) + (Ro - \Delta R)] \quad (16)$$
$$= 2IRo \quad (17)$$
$$Vo = 2IRo[(Ro - \Delta R)/(2Ro)] \quad (18)$$
$$= IRo - I\Delta R \quad (19)$$

Figure 6A:
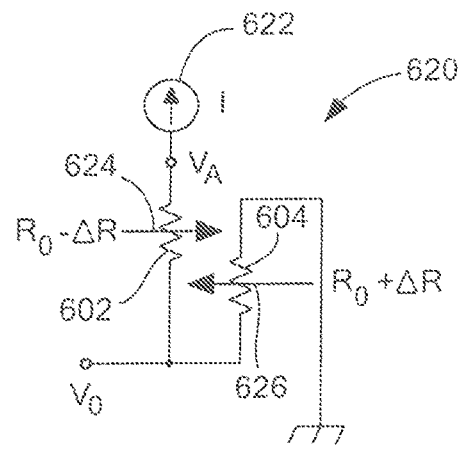
Figure 7:
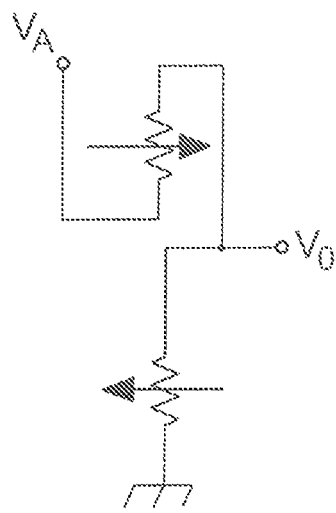
FIGS. 7 and 7A are block diagrams of two magnetoresistance elements coupled in the first half bridge series arrangement and driven by voltage sources in two different directions.
Figure 7A:
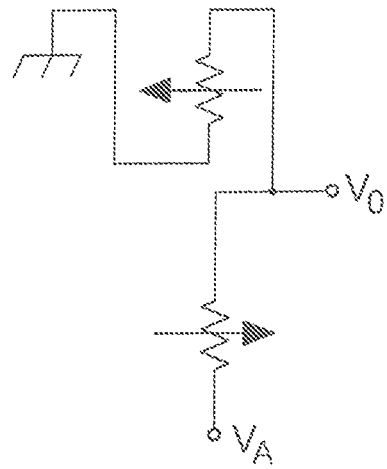
Figure 8:
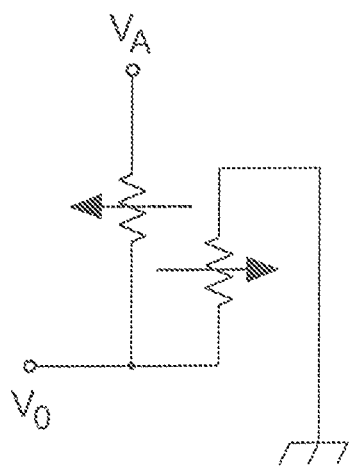
FIGS. 8 and 8A are block diagrams of two magnetoresistance elements coupled in the second different half bridge series arrangement and driven by voltage source in two different directions.
Figure 8A:
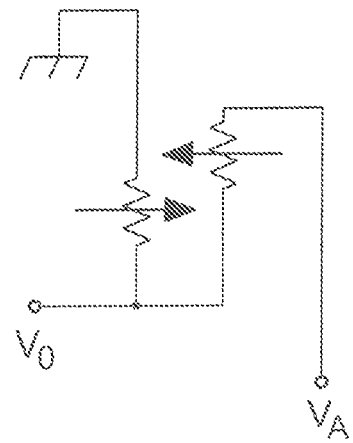

Referring now to FIG. 6A, a circuit 620 is like the circuit 600 of FIG. 6, except that a current source 622 generates a current in an opposite direction from the current generated by the current source 606 of FIG. 6.

Under these conditions, the first magnetoresistance element 602 experiences a static magnetic field in a direction 624 generated by current from the current source 622. The second magnetoresistance element 604 experiences a static magnetic field in a direction 626 (opposite from the direction 624 generated by the current from the current source 622.

Accordingly, the first and second magnetoresistance elements 602, 604 do not experience a zero magnetic field and do not have the nominal resistance, Ro, indicated in FIG. 1. Instead, the resistance of the first magnetoresistance element 602 can be Ro−ΔR. The resistance of the second magnetoresistance element 604 can be Ro+ΔR. An output voltage 628 from the circuit 620 can be computed from:

$$VA = -I[(Ro - \Delta R) + (Ro + \Delta R)] \quad (20)$$
$$= -2IRo \quad (21)$$
$$Vo = 2IRo[(Ro + \Delta R)/(2Ro)] \quad (22)$$
$$= -IRo - I\Delta R \quad (23)$$

For FIGS. 9, 9A, 9B below, the circuits 600, 620 are considered to be the same half bridge circuit and the current sources 606, 622 are instead considered to be one current source that switches direction of the drive current I, and therefore, also switches direction of the resulting in an AC mixing current, and also resulting in a self-generated AC mixing magnetic field.

As described above, for FIGS. 9, 9A, 9B below, the circuits 500, 520 are also considered to be the same half bridge circuit and the current sources 506, 522 are instead considered to be one current source that switches direction of the drive current I, resulting in an AC mixing current, and also resulting in a self-generated AC mixing magnetic field.

As also described above, it should be understood that, when alternated periodically in two directions, the AC mixing current and the resulting self-generated AC mixing magnetic field provide the above described mixing.

Furthermore, the circuit(s) of FIGS. 5 and 5A can form one half bridge of a full bridge circuit and the circuit(s) of FIGS. 6 and 6A can form the other half bridge of a full bridge circuit. An outcome of the full bridge circuit is described below in conjunction with FIG. 9B.

In equations (8)-(23) above, it is assumed that the voltage VA remains constant, the nominal value (center operating point) of magnetoresistance elements is Ro, and the sensed external magnetic field is zero. This assumption is not true when the magnetoresistance element experiences a non-zero sensed external magnetic field, in which case the nominal resistance of the magnetoresistance elements changes. However, it will become apparent from discussion below in conjunction with FIGS. 9-9B that, in operation, the nominal resistance terms (either Ro or some other resistance) cancel, leaving only a ΔR terms, and equations (8)-(23) above provide a correct average DC value for half bridge circuits and for full bridge circuits.

Referring now to FIGS. 7, 7A, 8, and 8A, circuits are similar to the circuits of FIGS. 5, 5A, 6, and 6A. However, the voltage sources VA are used to drive the various circuits instead of current sources. Where the voltages labeled VA in FIGS. 5A and 6A are shown in equations 12 and 20 to be negative voltages, the same drive is achieved in the circuits of FIGS. 7A and 8A by positive voltages VA at the opposite end of the magnetoresistance elements.

Equations the same as or similar to those above for of FIGS. 5, 5A, 6, and 6A result. Thus, the magnetoresistance elements for the half bridge arrangements (and full bridge arrangements) can be driven with either current sources or with voltage sources to achieve the same results described more fully below.

Figure 9:
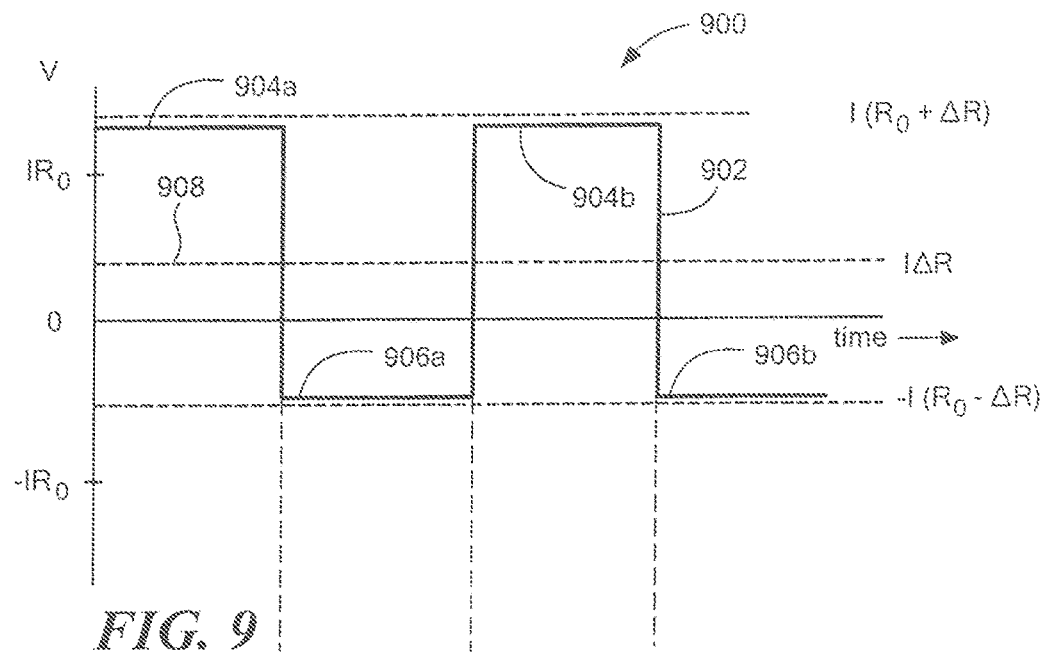
FIGS. 9, 9A, and 9B are graphs showing the output values from the two magnetoresistance elements coupled in the half bridge series arrangements of FIGS. 5 and 5A, 6 and 6A, 7 and 7A, or 8 and 8A, or combinations thereof in a full bridge arrangement, when driven with currents or voltages in the two different directions and when in the presence of a zero sensed external magnetic field.
Figure 9A:
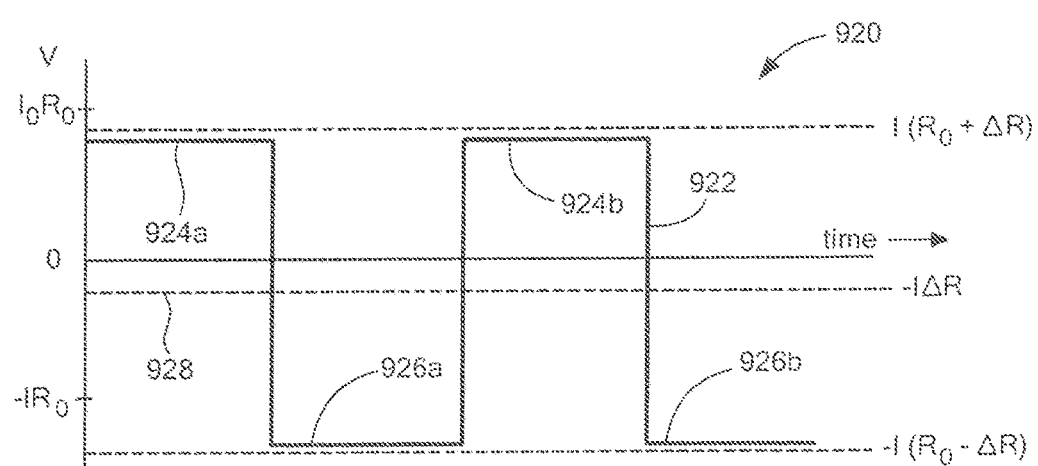

Referring now to FIGS. 9, 9A, 9, graphs 900, 920, 940 each have a respective horizontal axis with a scale in units of time in arbitrary units. The graphs 900, 920, 940 also each have a respective vertical axis with a sale in units of volts in arbitrary units.

The graph 900 has a signal 902 with alternating high states 904a, 904b and low states 906a, 906b. Voltages at the two states are in accordance with the circuits of FIGS. 5 and 5A or FIGS. 7 and 7A (each taken as one respective circuit driven with and AC mixing current having alternating directions), which are in accordance with equations (11) and (15).

An average (DC) voltage value 908 of the signal 902 is:

$$Vdc1 = I\Delta R. \tag{24}$$

Note that the Ro terms have canceled.

The graph 920 has a signal 922 with alternating high states 924a, 924b and low states 926a, 926b. Voltages at the two states are in accordance with the circuits of FIGS. 6 and 6A or FIGS. 8 and 8A (each taken as one respective circuit driven with and AC mixing current having alternating directions), which are in accordance with equations (19) and (23).

An average (DC) voltage value 928 of the signal 922 is:

$$Vdc2 = -I\Delta R. \tag{25}$$

Again, the Ro terms have canceled.

The graph 940 has a DC level 942 shown, which is representative of a difference between the signals 902 and 922.

$$Vdc = 2I\Delta R, \tag{26}$$

which is double the average (DC) value of the signals 902 and 922.

The above difference can be physically achieved if the circuit(s) of FIGS. 5 and 5A (see, e.g., FIG. 9) forms one half bridge part of a full bridge circuit and the circuit(s) of FIGS. 6 (see, e.g., FIG. 9A) and 6A forms the other half bridge part of the full bridge circuit. Similarly, the difference can be physically achieved if the circuit(s) of FIGS. 7 and 7A (see, e.g., FIG. 9) forms one half bridge part of a full bridge circuit and the circuit(s) of FIGS. 8 and 8A (see, e.g., FIG. 9A) forms the other half bridge part of the full bridge circuit. A full bridge circuit generates a differential signal.

A residual AC voltage 944 can remain as a result of possible small mismatches between the two half bridge circuits, i.e., small mismatches between the two signals 902, 922, resulting from physically different magnetoresistance elements used in the two half bridge circuits.

The AC signal 944 can be removed with a low pass filter or the like, leaving only the DC voltage 942.

As described above, the DC voltage 942 is related to a slope of the region of the transfer curve 102 of FIG. 1 in which the magnetoresistance elements operate. As described above, the operating region is influenced by a sensed external magnetic field.

It will be apparent from the signals 902 and 922, that the voltage signal generated by the half bridge circuits of FIGS. 5, 5A, 6, 6A, 7, 7A, 8, 8A (and also by the single element circuit of FIGS. 2 and 2A) has both a DC component and an AC component. It will also be apparent that the signal 942 generated by the full bridge circuit has primarily a DC signal component, but can also have an AC signal component due to element mismatches.

For both half bridge and full bridge circuits, the AC component of the output signals can be removed with a low pass filter or the like.

Figure 10:
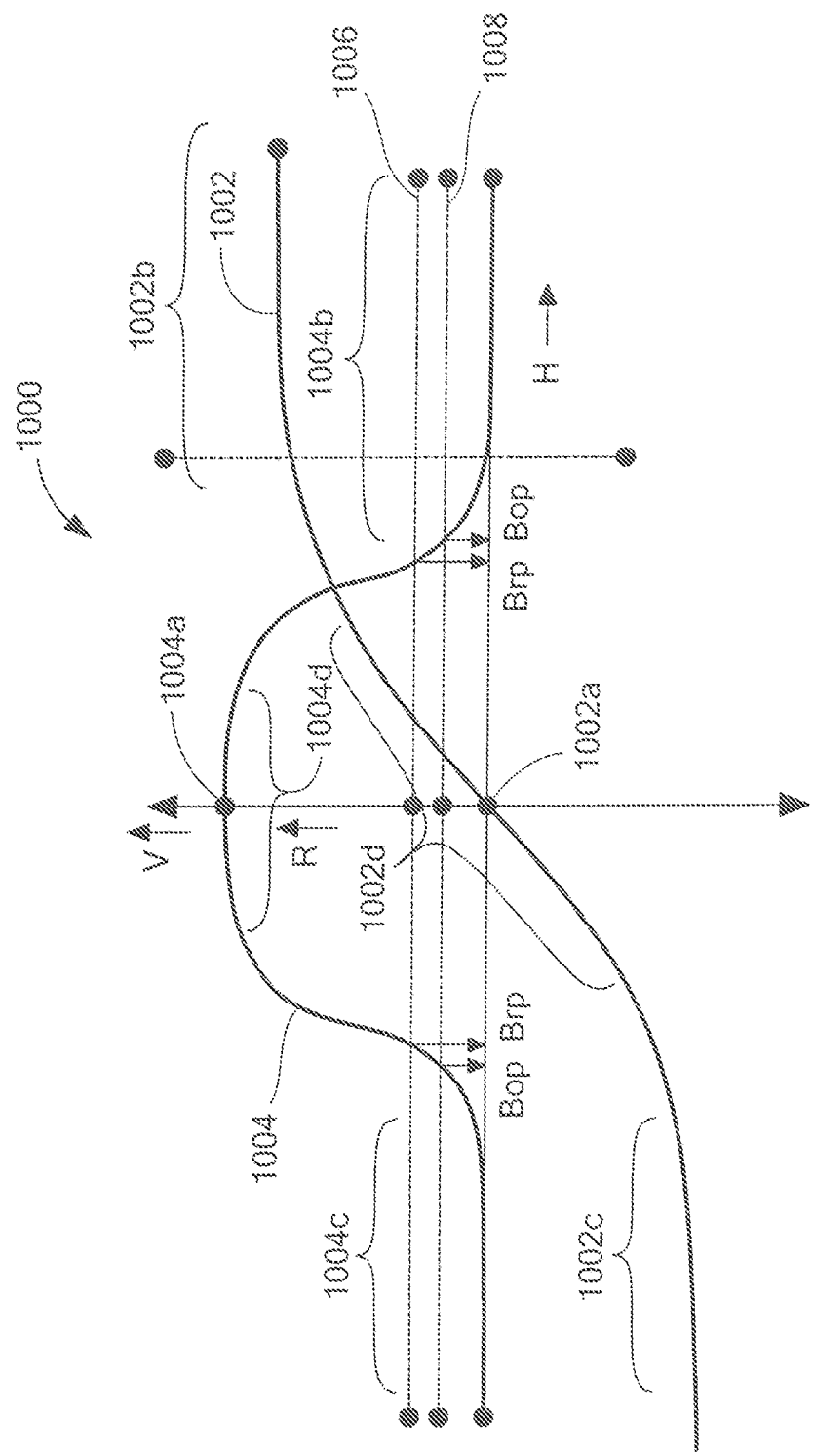
FIG. 10 is a graph showing a DC output signal or a DC component of an output signal from the two magnetoresistance elements coupled in the half bridge series arrangements of FIGS. 5 and 5A, 6 and 6A, 7 and 7A, or 8 and 8A, or combinations thereof in a full bridge arrangement, over a range of external magnetic field signals.

Referring now to FIG. 10, a graph 1000 has a horizontal axis with a scale in units of magnetic field strength in arbitrary units. The graph 1000 also has a vertical axis with a scale in units of volts in arbitrary units and in resistance in arbitrary units.

A curve 1002, like the curve 102 of FIG. 1, again shows a transfer characteristic of a magnetoresistance element. The curve 1002 has an upper saturation region 1002b and a lower saturation region 1002c. A point 1002a on the curve 1002 is representative of a resistance of the magnetoresistance element when the magnetoresistance element experiences a zero sensed external magnetic field (and has no AC mixing magnetic field). Between the upper and lower saturation regions 1002b, 1002c is a linear region 1002d.

Figure 9B:
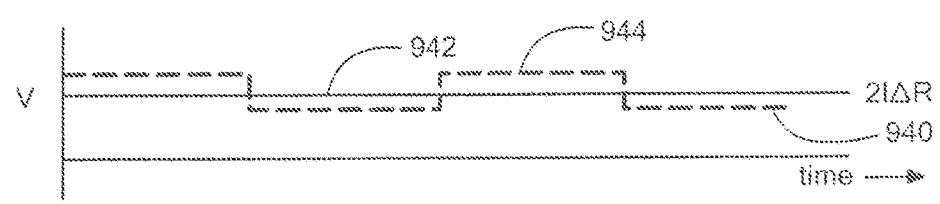

A curve 1004 is representative of the DC voltage signal 942 of FIG. 9B for a full bridge circuit, or of a DC signal component of any of the above-described half bridge or single element magnetoresistance element circuits, that experience mixing, as the magnetoresistance element(s) experiences different sensed external magnetic fields, moving the operating region to the right or to the left on the transfer curve 1002.

As described above, the DC output voltage or DC output voltage components of the above described circuits, when mixing occurs, is representative of a slope of the transfer curve 1002 in the region that a sensed magnetic field operates in the transfer curve 1002.

For sensed external magnetic fields within the linear region 1002d of the transfer curve 1002, the resulting DC voltage or DC voltage components is represented by relatively flat region 1004d of the curve 1004, i.e., a non-zero value. For sensed external magnetic fields within the upper saturation region 1002b of the transfer curve 1002, the resulting DC voltage or DC voltage component is represented by the region 1004b of the curve 1004, i.e., an approximately zero value. For sensed external magnetic fields within the lower saturation region 1002c of the transfer curve 1002, the resulting DC voltage or DC voltage component is represented by the region 1004c of the curve 1004, i.e., an approximately zero value.

It should be recognized that a transition between the voltage in the region 1004d and regions 1004b, 1004c is relatively sharp, and it takes only a small change in the sensed external magnetic field to affect the change in output voltage. Thus, the above-described mixed magnetoresistance element circuits can function as magnetic switches or proximity detectors to sense the presence, absence, or proximity of a magnetic (or ferromagnetic) object that generates a sensed external magnetic field.

Circuits described below can use one or two thresholds 1006, 1008, e.g., an operating point threshold, Bop, 1008 and/or a release point threshold, Brp, 1006 and can compare the DC signal 1004 with the threshold(s) to sense the presence, absence, or proximity of a magnetic (or ferromagnetic) object.

FIGS. 11-15 show magnetic field sensors and associated circuits that use one magnetoresistance element, two magnetoresistance elements coupled in a half bridge arrangement, and four magnetic magnetoresistance elements coupled in a full bridge arrangement.

Figure 11:
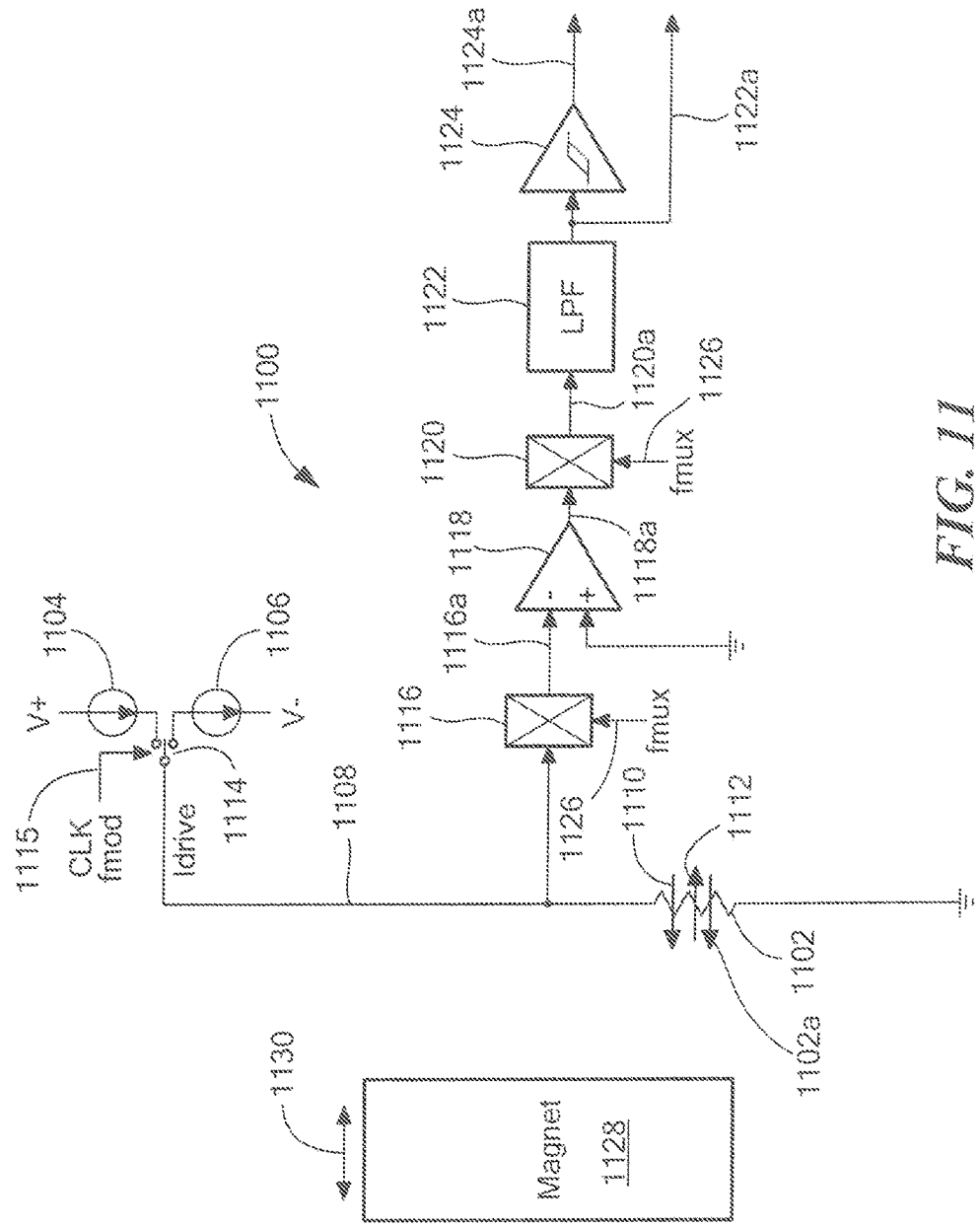
FIG. 11 is a block diagram of a magnetic field sensor using one magnetoresistance element.

Referring now to FIG. 11, a magnetic field sensor 1100 can include one magnetoresistance element 1102. The magnetoresistance element 1102 can have a directional maximum response axis 1102a.

The magnetoresistance element 1102 can be driven with an AC mixing current 1108 having alternating directions by first and second current sources 1104, 1106, respectively, coupled to the magnetoresistance element 1102 via a switch 1114. The switch 1114 is coupled to receive a modulated clock signal 1115. As described above in conjunction with FIGS. 2 and 2A, the AC mixing current 1108 passing through the magnetoresistance element 1102 causes a self-generated AC mixing magnetic field directed in two directions 1110, 1112 in accordance with the two directions of the AC mixing current 1108.

It will be understood that a frequency, f, of the AC mixing current 1108 is the same as a frequency, f, of the self-generated AC mixing magnetic field having directions 1110, 1112. Thus, mixing occurs and a voltage signal 1108 with a DC component is generated at the top end of the magnetoresistance element 1102.

In some embodiments, a multiplexer 1116 is coupled to receive the voltage signal 1108 and configured to generate a multiplexed signal 1116a. An amplifier 1118 can be coupled to receive the multiplexed signal 1116a and configured to generate an amplified signal 1118a. A demultiplexer 1120 can be coupled to receive the amplified signal 1118a and configured to generate a multiplexed signal 1120a. A low pass filter 1122 can be coupled to receive the multiplexed signal 1120a and configured to generate a filtered signal 1122a. A comparator 1124, for example, a Schmidt trigger, having two thresholds, can be coupled to receive the filtered signal 1122a and configured to generate a comparison signal 1124a.

Operation of the magnetoresistance element 1102 experiencing mixing is described above in conjunction with FIGS. 2, 2A, 3, 3A, and 4.

The first multiplexer 1116 and the second multiplexer 1120 can essentially provide a chopping surrounding the amplifier 1118. Chopper stabilization is a known technique to reduce the effects of offset voltage, i.e., unwanted DC voltage, of the amplifier 1118. The chopping can operates with a clock signal 1126 with a frequency higher than a frequency of a cock 1115 that modulates a current 1208.

The low pass filter 1122 can remove an AC signal component, for example, the AC signal component of the signal 402 of FIG. 4, leaving only the DC component, for example, the DC component 412 of FIG. 4.

When a magnet 1128 is brought near the magnetoresistance element 1102, for example, along a line 1130, the comparison signal 1124a takes on a first state, for example, a low state. When the magnet 1128 is moved away from the magnetoresistance element 1102, the comparison signal 1124a takes on the second state, for example, a high state. This operation should be understood from the discussion above in conjunction with FIG. 10. The movement need not be along a straight line or along a line parallel to the maximum response axis 1102a.

The filtered signal 1122a does not take on only two states, but instead, takes on a range of values in accordance with the curve 1004 FIG. 10.

The magnetic field sensor 1100 does not necessarily include a magnet 1128. Electronic components shown as the magnetic field sensor 1100 can be disposed upon a common semiconductor substrate.

Figure 12:
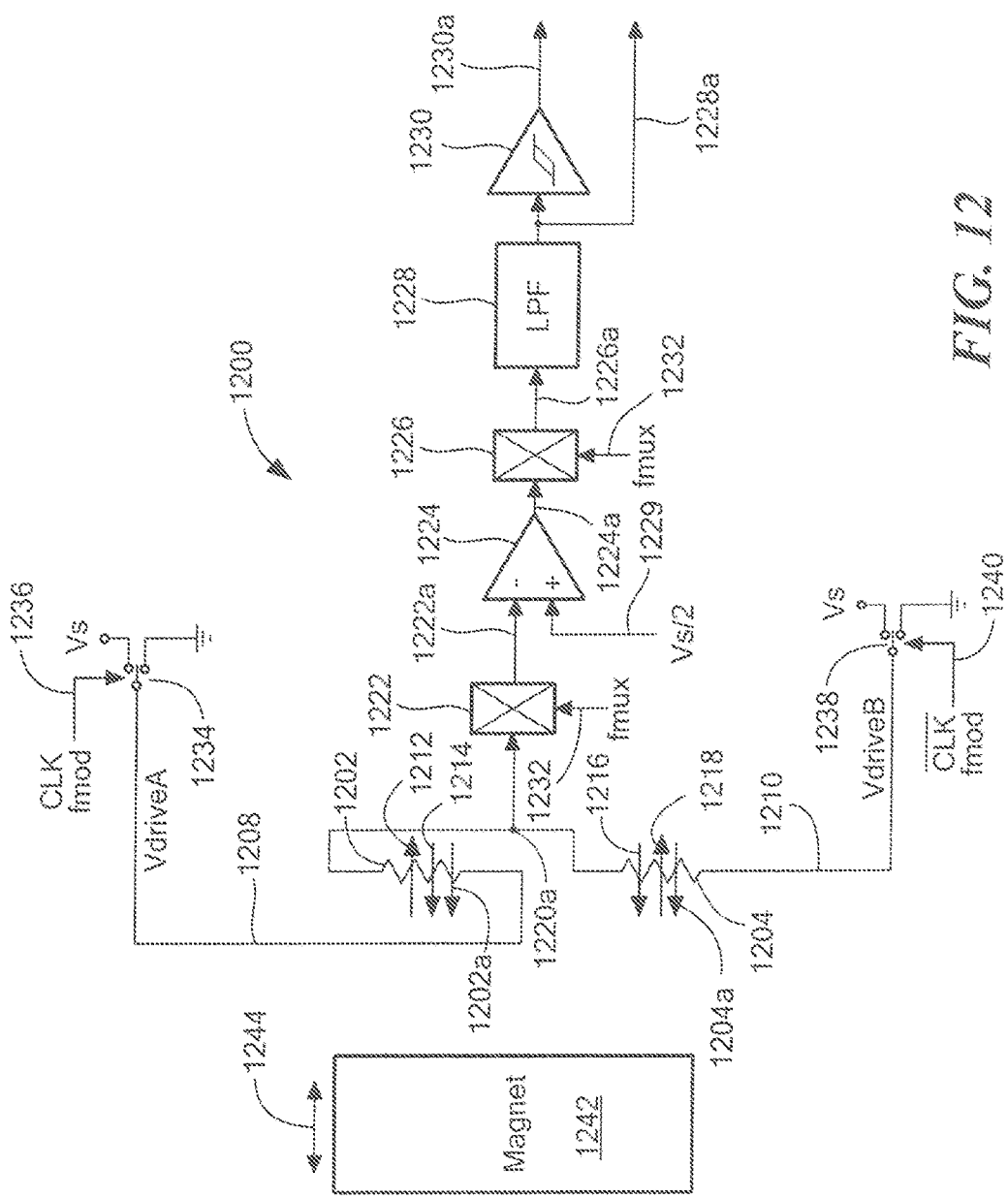
FIG. 12 is a block diagram of a magnetic field sensor using two magnetoresistance elements coupled in a half bridge series arrangement.

Referring now to FIG. 12, a magnetic field sensor 1200 can include first and second magnetoresistance elements 1202, 1204, respectively, coupled in half bridge arrangement. The first magnetoresistance element 1202 can have a directional maximum response axis 1202a, and, in some embodiments, the second magnetoresistance element 1204 can have a directional maximum response axis 1204a in the same direction as the directional maximum response axes 1202a. In other words, the first and second magnetoresistance elements 1202, 1204 can be fabricated exactly the same way and oriented in exactly the same direction upon a semiconductor substrate.

The first and second magnetoresistance elements 1202, 1204 can be driven with an AC mixing current 1208 (also 1210) having alternating directions by first and second voltage sources formed by first and second switches 1234, 1238 coupled to a voltage, Vs, and to ground. The first and second switches 1234, 1238 can be coupled as shown to the first and second magnetoresistance elements 1202, 1204 such that the current flows in one direction through the first magnetoresistance element 1202 and in an opposite physical direction through the second magnetoresistance element 1204. This coupling is the same as or similar to the coupling shown in half bridge circuits of FIGS. 5, 5A, 7, and 7A. However, in other embodiments, the coupling arrangement of FIGS. 6, 6A, 8, 8A could instead be used.

As described above in conjunction with FIGS. 5 and 5A, the SC mixing current 1208 (also 1210) passing through the first and second magnetoresistance elements 1202, 1204 causes respective self-generated AC mixing magnetic fields directed in directions 1112, 1114 at the first magnetoresistance element 1202 and directed in directions 1216, 1218 at the second magnetoresistance element 1204 (one hundred eighty degrees out of phase) in accordance with the two directions of the AC mixing current 1208 (also 1210).

It will be understood that a frequency, f, of the AC mixing current 1208 (also 1210) is the same as a frequency, f, of the self-generated AC mixing magnetic fields having directions 1212, 1214, 1216, 1218. Thus, mixing occurs and a voltage signal 1220a with a DC component is generated at a junction of the two magnetoresistance elements 1202, 1204.

A multiplexer 1222, an amplifier 1224, a demultiplexer 1226, a low pass filter 1228, and a comparator 1230 can be the same as or similar to the multiplexer 1116, the amplifier 1118, the demultiplexer 1120, the low pass filter 1122, and the comparator 1124 of FIG. 11. Signals 1220a, 1222a, 1224a, 1226a, 1228a, 1230a are the same as or similar to signals 1116a, 1118a, 1120a, 1122a, and 1124a, respectively. Here, however, the amplifier 1224 can be biased with a bias signal 1229.

Operation of the first and second magnetoresistance elements 1202, 1204 experiencing mixing is described above in conjunction with FIGS. 5, 5A, 7, 7A, 9, and 9B The low pass filter 1228 can remove an AC signal component, for example, the AC signal component of the signal 902 of FIG. 9, leaving only the DC component, for example, the DC component of FIG. 9.

Sensing of a magnet 1242 is the same as or similar to the sensing of the magnet 1128 described above in conjunction with FIG. 11. An example of movement of the magnet 1242 is shown by a line 1244. However, the movement need not be along a straight line or along a line parallel to the maximum response axes 1202a, 1204a.

The magnetic field sensor 1200 does not necessarily include a magnet 1242. Electronic components shown as the magnetic field sensor 1200 can be disposed upon a common semiconductor substrate.

Figure 13:
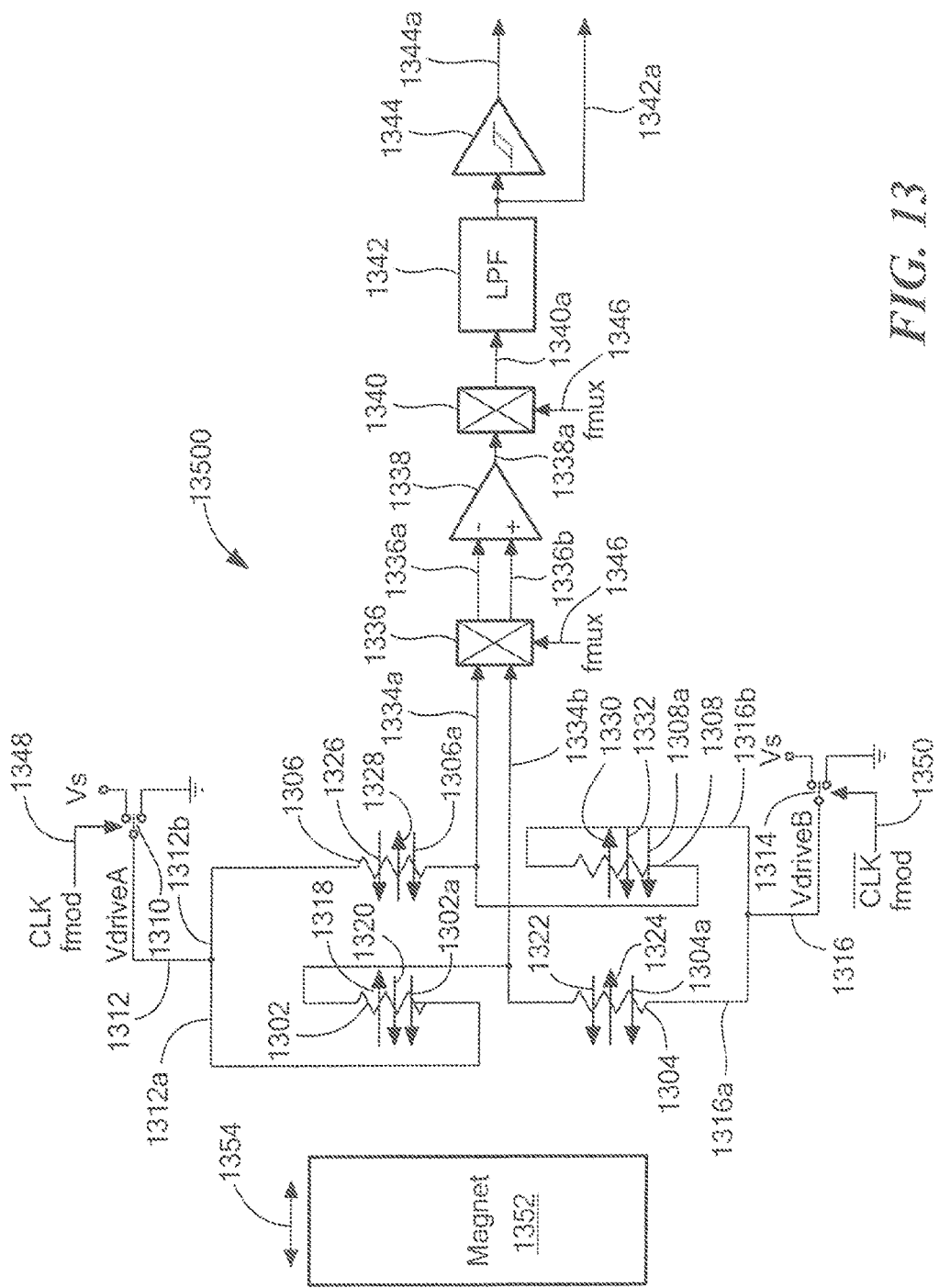
FIG. 13 is a block diagram of a magnetic field sensor using four magnetoresistance elements coupled in a full bridge arrangement.

Referring now to FIG. 13, a magnetic field sensor 1300 can have a first half bridge comprised of first and second magnetoresistance elements 1302, 1304, respectively, coupled in series, and a second half bridge comprised of third and fourth magnetoresistance elements 1306, 1308, respectively, coupled in series.

The first magnetoresistance element 1302 can have a directional maximum response axis 1302a, and, in some embodiments, the second magnetoresistance element 1304 can have a directional maximum response axis 1304a in the same direction as the directional maximum response axes 1302a. In other words, the first and second magnetoresistance elements 1302, 1304 can be fabricated exactly the same way and oriented in exactly the same direction upon a semiconductor substrate.

The third magnetoresistance element 1306 can have a directional maximum response axis 1306a, and, in some embodiments, the fourth magnetoresistance element 1308 can have a directional maximum response axis 1308a in the same direction as the directional maximum response axis 1306a. In other words, the third and fourth magnetoresistance elements 1306, 1308 can be fabricated exactly the same way and oriented in exactly the same direction. Also, the first, second, third, and fourth magnetoresistance elements 1302, 1304, 1306, 1308, respectively, can all be fabricated exactly the same way and oriented in exactly the same direction upon the same semiconductor substrate.

The first and second magnetoresistance elements 1302, 1304 can be driven with an AC mixing current 1312 (also 1316), that splits between currents 1312a (also 1316a) and 1312b (also 1316b). The current splitting can be equal if the two half bridge circuits have exactly the same resistances. However, if the two half bridge circuits do not have exactly the same resistances, the current splitting is not exactly equal and may contribute to the AC signal component 944 of FIG. 9B.

In some alternate embodiments, the AC mixing currents 1312a (and also 1316a) and 1312b (and also 1316b) are separately generated. In some embodiments, the separately generated AC mixing currents have different frequencies but achieve the same mixing effect described herein.

The AC mixing current 1312 (also 1316) has alternating directions by first and second voltage sources formed by first and second switches 1310, 1314 coupled to a voltage, Vs, and to ground. The first and second switches 1310, 1314 can be coupled as shown to the first, second, third, and fourth magnetoresistance elements 1302, 1304, 1306, 1308.

The AC mixing current 1312a (also 1316a) flows in one direction through the first magnetoresistance element 1302 and in an opposite physical direction through the second magnetoresistance element 1304. The current 1312b (also 1316b) flows in one direction through the third magnetoresistance element 1306 and in an opposite physical direction through the fourth magnetoresistance element 1308. This coupling is the same as or similar to the coupling shown in half bridge circuits of FIGS. 5, 5A, 6, and 6A and also in FIGS. 7, 7A, 8, 8A.

As described above in conjunction with FIGS. 5 and 5A, the AC mixing current 1312a (also 1316a) passing through the first and second magnetoresistance elements 1302, 1304 causes respective self-generated AC mixing magnetic fields directed in directions 1318, 1320 at the first magnetoresistance element 1302 and directed in directions 1322, 1324 at the second magnetoresistance element 1304 (one hundred eighty degrees out of phase) in accordance with the two directions of the alternating current 1312a (also 1316a).

As described above in conjunction with FIGS. 6 and 6A, the modulated current drive 1312b (also 1316b) passing through the third and fourth magnetoresistance elements 1306, 1308 causes respective self-generated AC mixing magnetic fields directed in directions 1326, 1328 at the third magnetoresistance element 1306 and directed in directions 1330, 1332 at the fourth magnetoresistance element 1308 (one hundred eighty degrees out of phase) in accordance with the two directions of the alternating current 1312b (also 1316b).

It will be understood that a frequency, f, of the AC mixing current 1312 (also 1316) is the same as a frequency, f, of the self-generated AC mixing magnetic fields having directions 1318, 1320, 1322, 1324, 1326, 1328, 1330, 1330. Thus, mixing occurs and a differential voltage signal 1334a, 1334b with a DC component is generated at a junction of the two magnetoresistance elements 1302, 1304. Refer to FIGS. 9-9B for a more detailed explanation.

A multiplexer 1336, an amplifier 1338, a demultiplexer 1340, a low pass filter 1342, and a comparator 1344 are the same as or similar to the multiplexer 1116, the amplifier 1118, the demultiplexer 1120, the low pass filter 1122, and the comparator 1124 of FIG. 11. Signals 1334a and 1334b, 1336a and 1336b, 1338a, 1340a, 1342a, 1344a are the same as or similar to signals 1116a, 1118a, 1120a, 1122a, and 1124a, respectively. Here, however, the amplifier 1338 is a differential amplifier with two input nodes.

Operation of the first and second magnetoresistance elements 1302, 1304 experiencing mixing is described above in conjunction with FIGS. 5, 5A, 7, 7A, 9, and 9A. Operation of the third and fourth magnetoresistance elements 1306, 1308 experiencing mixing is described above in conjunction with FIGS. 6, 6A, 8, 8A, 9, and 9A. Operation of the full bridge having two half bridges is described above in conjunction with FIG. 9B.

The low pass filter 1342 can remove an AC signal component, for example, the AC signal component 944 of FIG. 9B, leaving only the DC component, for example, the DC component of 942 FIG. 9.

Sensing of a magnet 1352 is the same as or similar to the sensing of the magnet 1128 described above in conjunction with FIG. 11. An example of movement of the magnet 1352 is shown by a line 1354. However, the movement need not be along a straight line or along a line parallel to the maximum response axes 1302a, 1304a, 1306a, 1308a.

The magnetic field sensor 1300 does not necessarily include a magnet 1352. Electronic components shown as the magnetic field sensor 1300 can be disposed upon a common semiconductor substrate.

Figure 14:
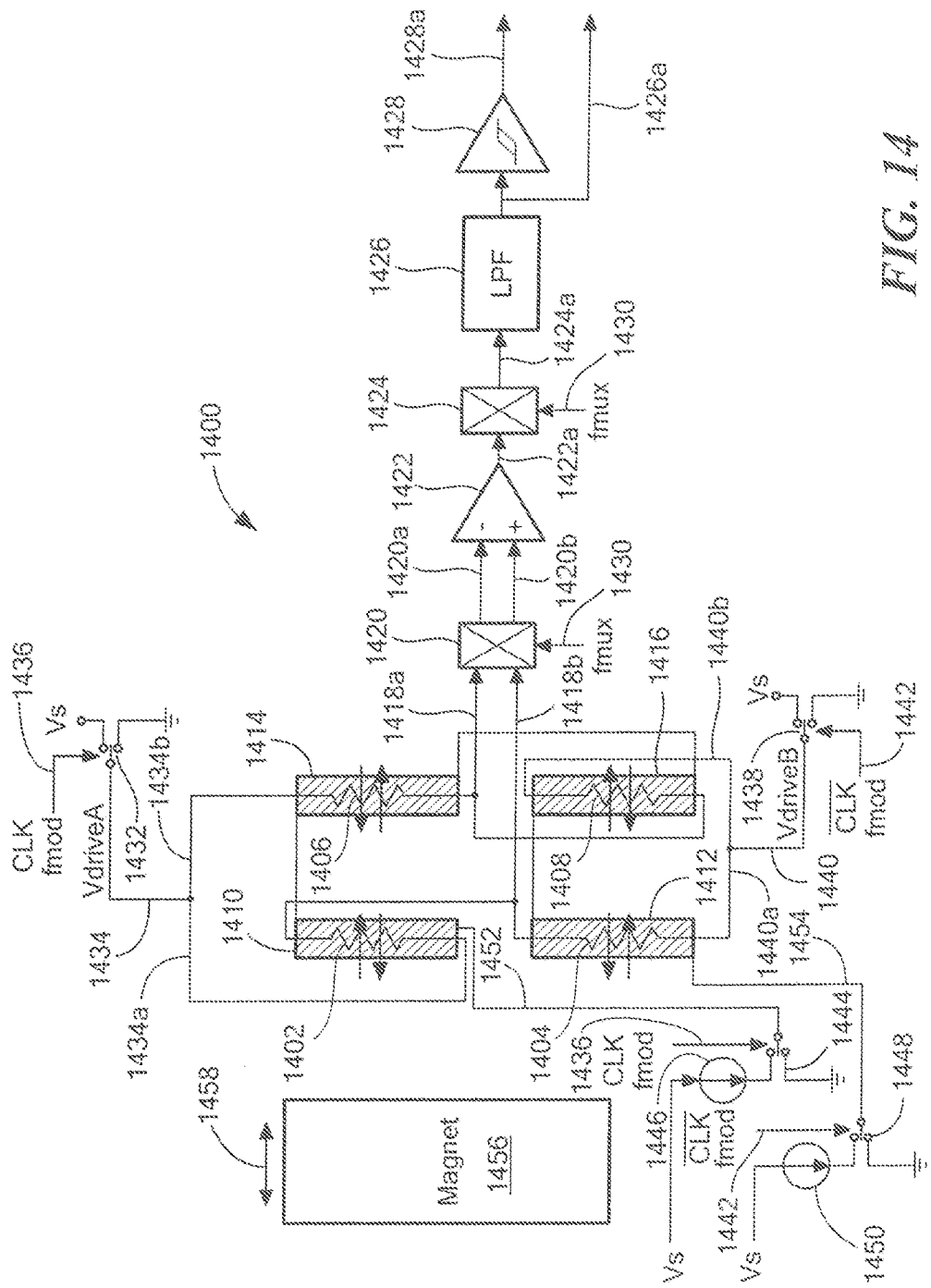
FIG. 14 is a block diagram of a magnetic field sensor using four magnetoresistance elements coupled in a full bridge arrangement and having four drive external magnetic field generators.

Referring now to FIG. 14, a magnetic field sensor 1400 can have a first half bridge comprised of first and second magnetoresistance elements 1402, 1404, respectively, coupled in series, and a second half bridge comprised of third and fourth magnetoresistance elements 1406, 1408, respectively, coupled in series to form a full bridge circuit.

The first, second, third, and fourth magnetoresistance elements 1402, 1404, 1406, 1408, respectively, can all be fabricated exactly the same way and oriented in exactly the same direction upon a common semiconductor substrate.

The first and second magnetoresistance elements 1402, 1404 can be driven with an AC mixing current 1434 (also 1440), that splits between currents 1434*a* (also 1440*a*) and 1434*b* (also 1440*b*). The AC mixing current has alternating directions by first and second voltage sources formed by first and second switches 1432, 1438 coupled to a voltage, Vs, and to ground. The first and second switches 1432, 1448 can be coupled as shown to the first, second, third, and fourth magnetoresistance elements 1402, 1404, 1406, 1408.

The AC mixing current 1434*a* (also 1440*a*) flows in one direction through the first magnetoresistance element 1402 and in an opposite physical direction through the second magnetoresistance element 1404. The current 1434*b* (also 1440*b*) flows in one direction through the third magnetoresistance element 1406 and in an opposite physical direction through the fourth magnetoresistance element 1408. This coupling is the same as or similar to the coupling shown in half bridge circuits of FIGS. 5, 5A, 6, and 6A and also in FIGS. 7, 7A, 8, 8A.

AC mixing currents and resulting self-generated AC mixing magnetic fields are the same as or similar to those described above in conjunction with FIG. 13. Here, however, other components also generate externally-generated AC mixing magnetic fields that add to and cause mixing in the same way as the self-generated AC mixing magnetic fields. To this end, the magnetic field sensor 1400 can include current conductors 1410, 1412, 1414, 1416 proximate to the first, second, third, and fourth magnetoresistance elements 1402, 1404, 1406, 1408, respectively. In some embodiments, the current conductors 1410, 1412, 1414, 1416 are coupled in series in such a way that an alternating current 1452 (also 1454) flowing through the current conductors generate externally-generated AC mixing magnetic fields at the first, second, third, and fourth magnetoresistance elements 1402, 1404, 1406, 1408, that add to the above-described self-generated AC mixing magnetic fields. The alternating current 1452 (also 1454) can be generated, for example, by current sources 1446, 1450 coupled though switches 1444, 1448, respectively, to opposite ends of the series coupled current conductors 1410, 1412, 1414, 1416.

The combined AC mixing magnetic fields are alternating magnetic fields that operate in the same way as the above-described self-generated AC mixing magnetic fields to provide mixing. However, the externally-generated AC mixing magnetic fields generated by the current conductors 1410, 1412, 1414, 1416 can be larger than the self-generated AC mixing magnetic fields resulting in larger values of ΔR in equations above and larger resulting DC voltages or DC voltage components.

In some embodiments, the externally-generated AC mixing magnetic fields are at the same phases (and frequency) as the self-generated AC mixing magnetic fields at each magnetoresistance element.

A multiplexer 1420, an amplifier 1422, a demultiplexer 1424, a low pass filter 1426, and a comparator 1428 are the same as or similar to the multiplexer 1116, the amplifier 1118, the demultiplexer 1120, the low pass filter 1122, and the comparator 1124 of FIG. 11. Signals 1418*a* and 1418*b*, 1420*a* and 1420*b*, 1422*a*, 1424*a*, 1426*a*, 1428*a* are the same as or similar to signals 1116*a*, 1118*a*, 1120*a*, 1122*a*, and 1124*a*, respectively. Here, however, the amplifier 1422 is a differential amplifier with two input nodes.

Operation of the first and second magnetoresistance elements 1402, 1404 experiencing mixing is described above in conjunction with FIGS. 5, 5A, 7, 7A, 9, and 9A. Operation of the third and fourth magnetoresistance elements 1406, 1408 experiencing mixing is described above in conjunction with FIGS. 6, 6A, 8, 8A, 9, and 9A. Operation of the full bridge having two half bridges is described above in conjunction with FIG. 9B.

The low pass filter 1426 can remove an AC signal component, for example, the AC signal component 944 of the signal 940 of FIG. 9B, leaving only the DC component, for example, the DC component of 942 FIG. 9.

Sensing of a magnet 1456 is the same as or similar to the sensing of the magnet 1128 described above in conjunction with FIG. 11. An example of movement of the magnet 1456 is shown by a line 1458. However, the movement need not be along a straight line or along a line parallel to the maximum response axes of the magnetoresistance elements 1402, 1404, 1406, 1408.

The magnetic field sensor 1400 does not necessarily include a magnet 1456. Electronic components shown as the magnetic field sensor 1400 can be disposed upon a common semiconductor substrate.

Figure 15:
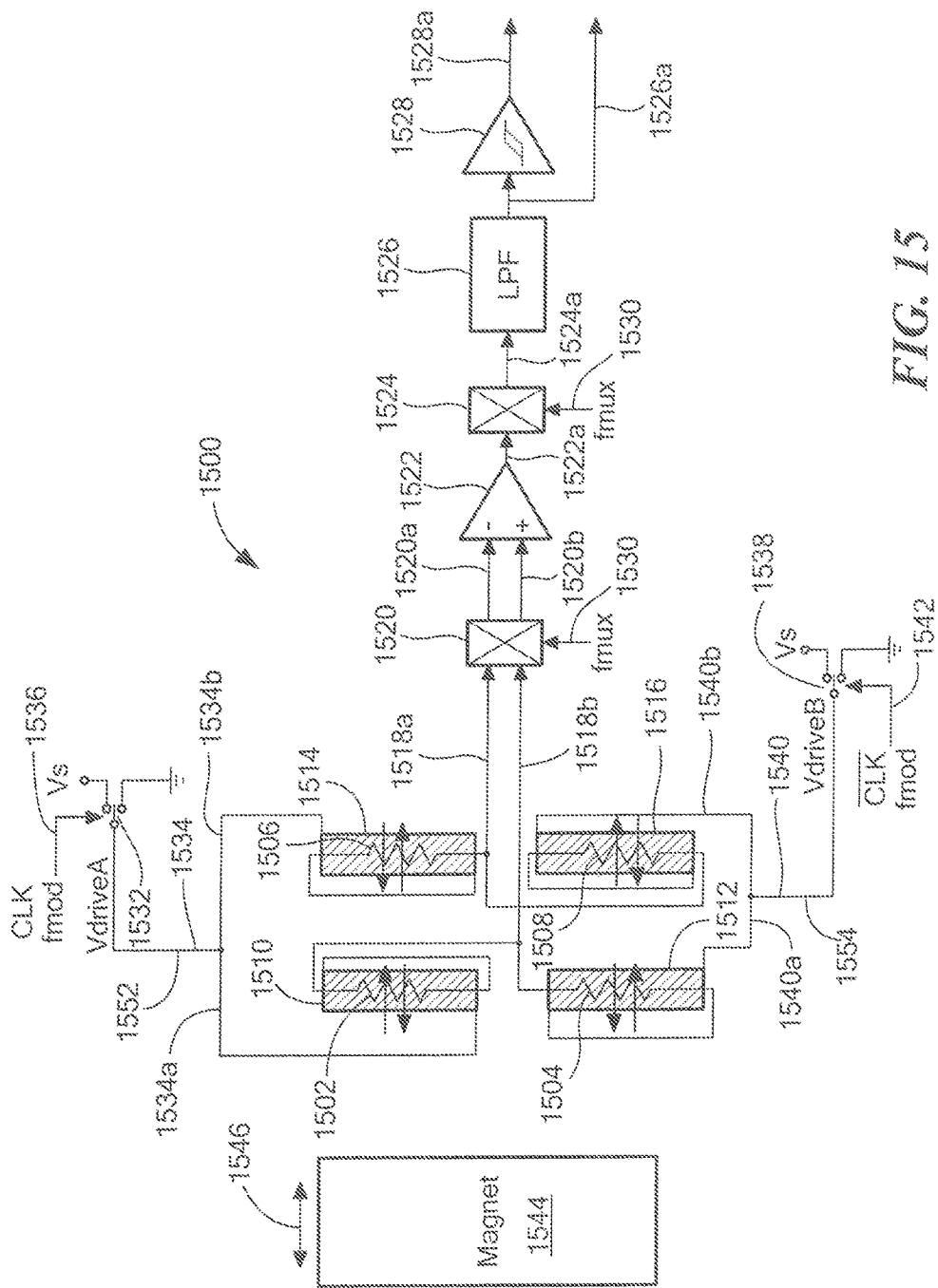
FIG. 15 is a block diagram of another magnetic field sensor using four magnetoresistance elements coupled in a full bridge arrangement and having four drive external magnetic field generators.

Referring now to FIG. 15, a magnetic field sensor 1500 can have a first half bridge comprised of first and second magnetoresistance elements 1502, 1504, respectively, coupled in series, and a second half bridge comprised of third and fourth magnetoresistance elements 1506, 1508, respectively, coupled in series to form a full bridge circuit.

The first, second, third, and fourth magnetoresistance elements 1502, 1504, 1506, 1508, respectively, can all be fabricated exactly the same way and oriented in exactly the same direction upon a common semiconductor substrate.

The first and second magnetoresistance elements 1502, 1504 can be driven with an AC mixing current 1534 (also 1540), that splits between currents 1534*a* (also 1540*a*) and 1534*b* (also 1540*b*). The AC mixing current has alternating directions by first and second voltage sources formed by first and second switches 1532, 1538 coupled to a voltage, Vs, and to ground. The first and second switches 1532, 1548 can be coupled as shown to the first, second, third, and fourth magnetoresistance elements 1502, 1504, 1506, 1508.

The AC mixing current 1534*a* (also 1540*a*) flows in one direction through the first magnetoresistance element 1502 and in an opposite physical direction through the second magnetoresistance element 1504. The current 1534*b* (also 1540*b*) flows in one direction through the third magnetoresistance element 1506 and in an opposite physical direction through the fourth magnetoresistance element 1508. This coupling is the same as or similar to the coupling shown in half bridge circuits of FIGS. 5, 5A, 6, and 6A and also in FIGS. 7, 7A, 8, 8A.

AC mixing currents and resulting self-generated AC mixing magnetic fields are the same as or similar to those described above in conjunction with FIG. 13. Here, however, like FIG. 14, other components generate externally-generated AC mixing magnetic fields that add to and cause mixing in the same way as the self-generated AC mixing magnetic fields. To this end, the magnetic field sensor 1500 can include current conductors 1510, 1512, 1515, 1516 proximate to the first, second, third, and fourth magnetoresistance elements 1502, 1504, 1506, 1508, respectively. In some embodiments, the current conductors 1510, 1512, 1514, 1516 are coupled in series in such a way that an alternating current 1552 (also 1554) flowing through the current conductors generates externally-generated AC mixing magnetic fields at the first, second, third, and fourth magnetoresistance elements 1502, 1504, 1506, 1508, that add to the above-described self-generated AC mixing magnetic fields. Unlike the arrangement of FIG. 14, the current conductors 1510, 1512, 1514, 1516 are coupled in series with the AC mixing currents 1534a (also 1540a) and 1534b (also 1540b), and no additional drive circuitry is need to drive the currents through the current conductors 1510, 1512, 1514, 1516. This arrangement saves power when compared to the magnetic field sensor 1400 of FIG. 14.

The combined AC mixing magnetic fields are alternating magnetic fields that operate in the same way as the above-described self-generated AC mixing magnetic fields to provide mixing. However, the external AC mixing magnetic fields generated by the current conductors 1510, 1512, 1515, 1516 can be larger than the self-generated AC mixing magnetic fields resulting in larger values of AR in equations above and larger resulting DC voltages or DC voltage components.

In some embodiments, the external AC mixing magnetic fields are at the same phases (and frequency) as the self-generated AC mixing magnetic fields at each magnetoresistance element.

A multiplexer 1520, an amplifier 1522, a demultiplexer 1524, a low pass filter 1526, and a comparator 1528 are the same as or similar to the multiplexer 1116, the amplifier 1118, the demultiplexer 1120, the low pass filter 1122, and the comparator 1124 of FIG. 11. Signals 1518a and 1518b, 1520a and 1520b, 1522a, 1524a, 1526a, 1528a are the same as or similar to signals 1116a, 1118a, 1120a, 1122a, and 1124a, respectively. Here, however, the amplifier 1522 is a differential amplifier with two input nodes.

Operation of the first and second magnetoresistance elements 1502, 1504 experiencing mixing is described above in conjunction with FIGS. 5, 5A, 7, 7A, 9, and 9A. Operation of the third and fourth magnetoresistance elements 1506, 1508 experiencing mixing is described above in conjunction with FIGS. 6, 6A, 8, 8A, 9, and 9A. Operation of the full bridge having two half bridges is described above in conjunction with FIG. 9B.

The low pass filter 1526 can remove an AC signal component, for example, the AC signal component 944 of the signal 944 of FIG. 9B, leaving only the DC component, for example, the DC component of 942 FIG. 9.

Sensing of a magnet 1544 is the same as or similar to the sensing of the magnet 1128 described above in conjunction with FIG. 11. An example of movement of the magnet 1544 is shown by a line 1546. However, the movement need not be along a straight line or along a line parallel to the maximum response axes of the magnetoresistance elements 1502, 1504, 1506, 1508.

The magnetic field sensor 1500 does not necessarily include a magnet 1544. Electronic components shown as the magnetic field sensor 1500 can be disposed upon a common semiconductor substrate.

Figure 16:
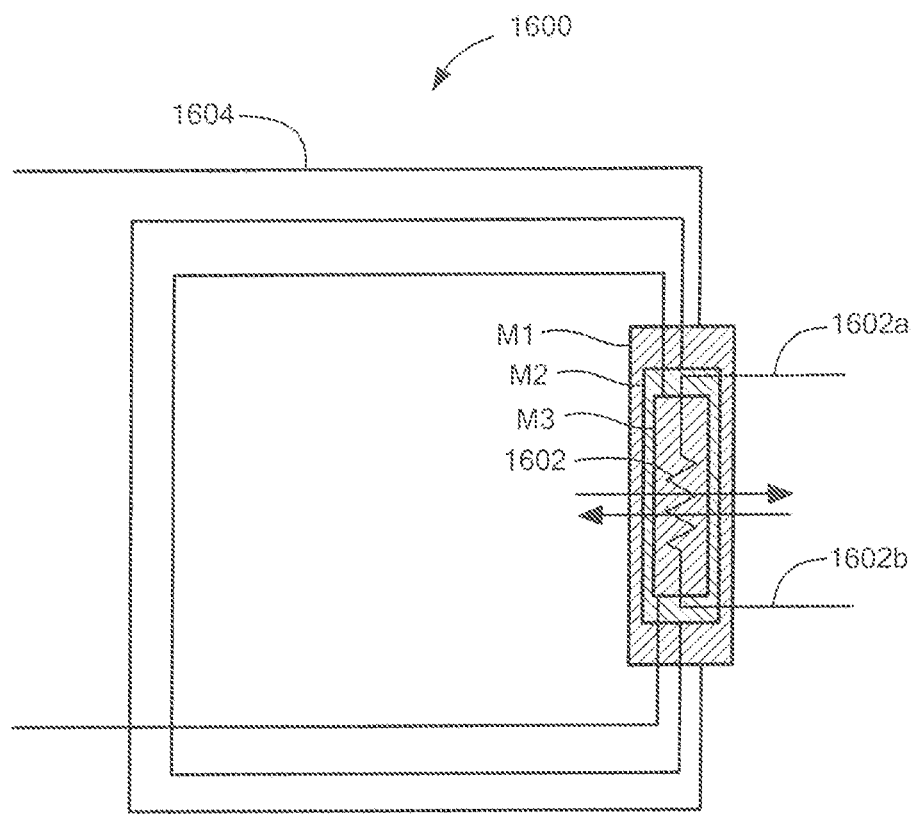
FIG. 16 is a block diagram of a magnetoresistance element and a drive external magnetic field generator, which can form any of the above drive external magnetic field generators, and in the form of a coil made from metal layers of an integrated circuit.

Referring now to FIG. 16, the current conductors 1410, 1412, 1414, 1416 of FIG. 14 and/or the current conductors 1510, 1512, 1516, 1518 of FIG. 15 can each be comprised of one or more loops in a semiconductor substrate, where each loop in formed in a different metal layer, e.g., M1, M2, M3 of the semiconductor substrate. Crosshatched patches represent current conductor portions, each under or over a respective magnetoresistance element 1602.

It will be appreciated that, using loops provides a higher externally-generated AC mixing magnetic field than any one current conductor passing by the magnetoresistance element 1602.

Having more than one loop results in larger values of AR in equations above and larger resulting DC voltages or DC voltage components.

Magnetic field sensors used as proximity detectors or magnetic switches are described above. Each magnetic field sensor above is configured to sense a proximity of a magnetic object, e.g., a magnet. Circuits below use similar circuits to detect a speed of rotation of a magnetic or of a ferromagnetic object.

Figure 17:
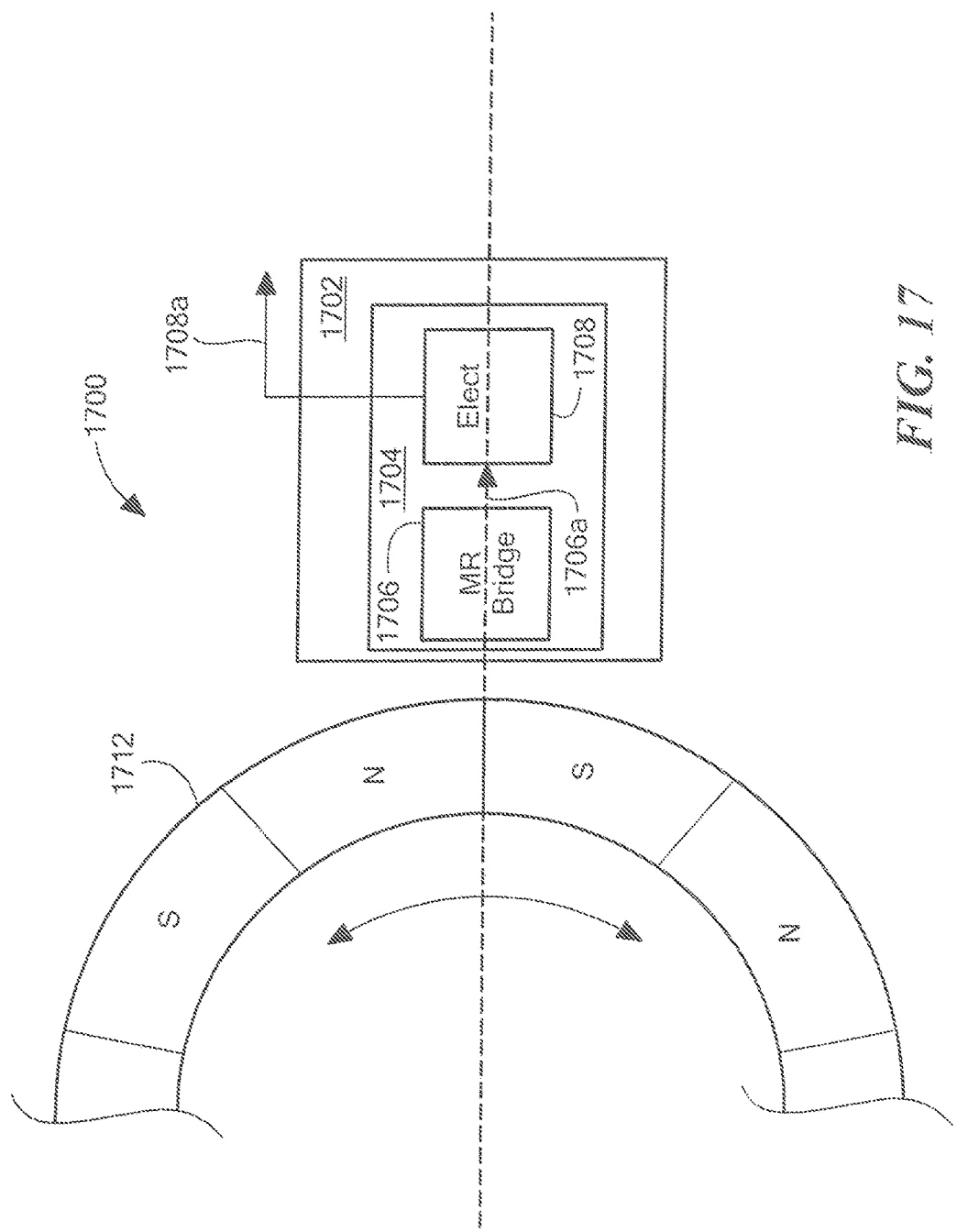
FIG. 17 is a block diagram of a magnetic field sensor, which can be in the form of any of the above magnetic field sensors, disposed proximate to a ring magnet, and configured to provide an output signal indicative of a rotation of the ring magnet.

Referring now to FIG. 17, a magnetic field sensor 1700 includes a magnetoresistance element bridge 1706 (or a single element) configured to generate a sensed signal 1706a. Electronics 1708 is coupled to receive the sensed signal 1706a and configured to generate an output signal. 1708a.

The magnetoresistance element bridge 1706 (or a single element) can be the same as or similar to any of the magnetoresistance element arrangements described above. The electronics 1708 can be the same as or similar to any of the electronic components described above.

The magnetic field sensor 1700 can also include an outer package 1702, for example, a plastic or a molded package.

Just as the magnetic field sensors of FIG. 11-15 provided an output signal indicative of a proximity of a magnet, the magnetic field sensor can provide the output signal 1708a indicative of proximity of north and south poles of a ring magnet 1712, with transitions at a rate proportional to a speed of rotation of the ring magnet 1712.

Magnetic field sensors that sense a movement or position of a line magnet having alternating north and south poles can operate in a similar way.

Figure 18:
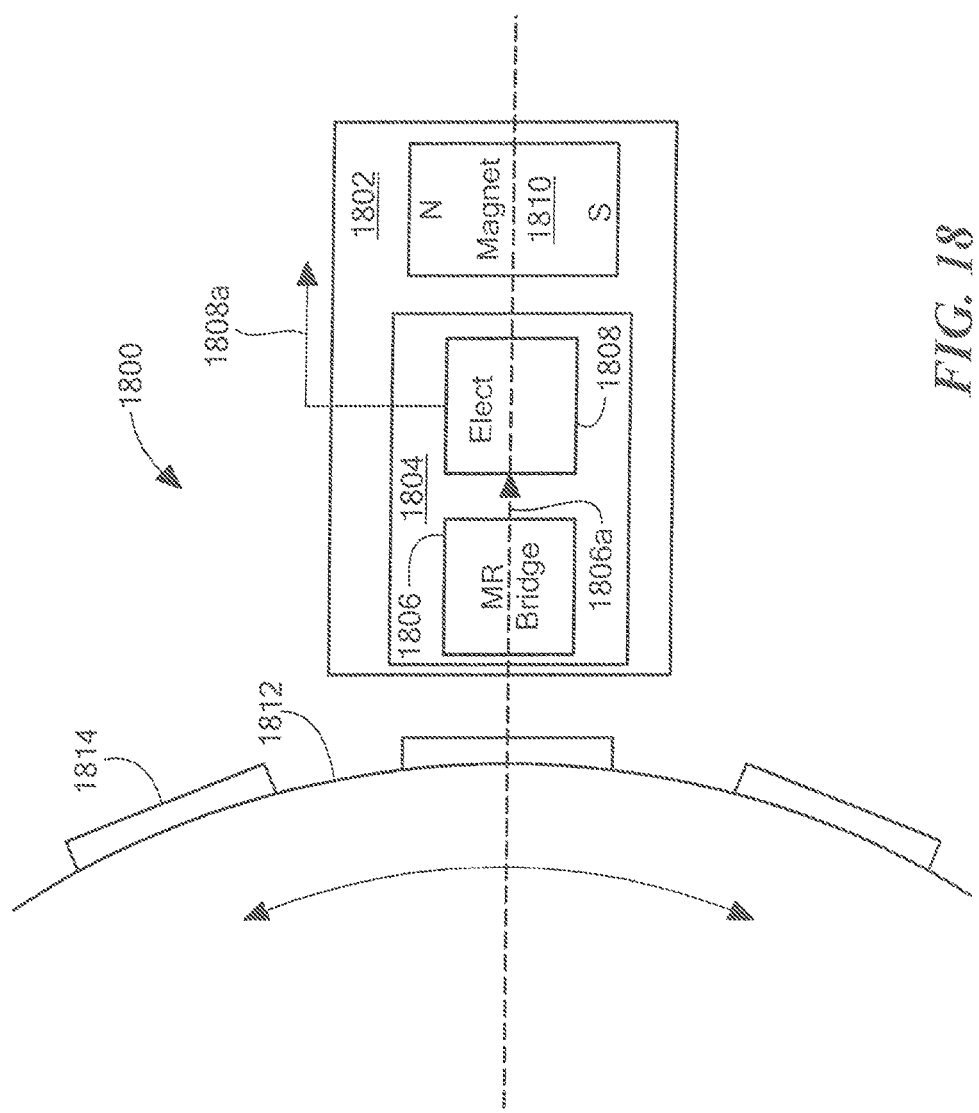
FIG. 18 is a block diagram of a magnetic field sensor, which can be in the form of any of the above magnetic field sensors, disposed proximate to a ferromagnetic gear, and configured to provide an output signal indicative of a rotation of the ferromagnetic gear.

Referring now to FIG. 18, a magnetic field sensor 1800 includes a magnetoresistance element bridge 1806 (or a single element) coupled to generate a sensed signal 1806a. Electronics 1808 is coupled to receive the sensed signal 1806a and configured to generate an output signal 1808a.

The magnetic field sensor 180 can include a permanent magnet 1810 that makes a DC magnetic field in the vicinity of the magnetoresistance element bridge (or single element).

The magnetoresistance element bridge 1806 (or a single element) can be the same as or similar to any of the magnetoresistance element arrangements described above. The electronics 1808 can be the same as or similar to any of the electronic components described above.

The magnetic field sensor 1800 can also include an outer package 1802, for example, a plastic or a molded package.

Just as the magnetic field sensors of FIG. 11-15 provided an output signal indicative of a proximity of a magnet, the magnetic field sensor 1800 can provide the output signal 1808a indicative of proximity of teeth, e.g., 1814, of a ferromagnetic gear 1812, with transitions at a rate proportional to a speed of rotation of the ferromagnetic gear.

As teeth of the ferromagnetic gear 1812 pass by the magnetoresistance element bridge (or single element), the teeth alter a magnitude and a direction of the magnetic field proximate to the magnetoresistance element bridge 1806 (or a single element) generated by the magnet 1810.

The magnet 1810 can within or upon or proximate to the package 1802.

While some embodiments are described above to include all electronic components on a single common semiconductor substrate, in other embodiments, the electronic components can be disposed on more than one semiconductor substrate. For example, in some embodiments, the above-describe magnetoresistance elements can be disposed on a first semiconductor substrate and other identified electronic components can be disposed on a second different semiconductor substrate, wherein the two substrate have signal connections therebetween.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A magnetic field sensor for sensing a sensed external magnetic field, the magnetic field sensor comprising:
    a first magnetoresistance element having a first node and a second node;
    a second magnetoresistance element having a first node and a second node, the second node of the first magnetoresistance element coupled to the first node of the second magnetoresistance element forming a first junction node coupling the first magnetoresistance element and the second magnetoresistance element in series;
    at least one current generating circuit operable to generate an AC mixing current, wherein at least a first portion of the AC mixing current is coupled to pass through the first and second series coupled magnetoresistance elements, wherein the AC mixing current has an AC current component with an AC current frequency; and
    at least one magnetic field generating circuit operable to generate a first AC mixing magnetic field proximate to the first magnetoresistance element and further operable to generate a second AC mixing magnetic field proximate to the second magnetoresistance element, wherein the first AC mixing magnetic field has a first AC magnetic field component with an AC magnetic field frequency the same as the AC current frequency, wherein the second AC mixing magnetic field has a second AC magnetic field component with the AC magnetic field frequency, wherein the first and second AC mixing magnetic fields result in an output signal appearing at the first junction node, wherein the output signal comprises a DC component that changes value in response to changes of the sensed external magnetic field.

2. The magnetic field sensor of claim 1, further comprising:
    a comparator coupled to receive a signal representative of the output signal and configured to compare the signal representative of the output signal with at least one threshold signal to generate an output signal having a first state indicative of a magnitude of the sensed external magnetic field being less than a first predetermined magnetic field magnitude and having a second state indicative of the magnitude of the sensed external magnetic field being greater than a selected one of the first predetermined magnetic field magnitude or a second different predetermined magnetic field magnitude.

3. The magnetic field sensor of claim 2, further comprising:
    a filter coupled between the first junction node and the comparator, the filter selected to remove an AC component of the output signal at the AC magnetic field frequency, wherein the filter is configured to generate a filtered signal, wherein the comparator is coupled to receive the filtered signal as the signal representative of the output signal.

4. The magnetic field sensor of claim 1, wherein the at least one magnetic field generating circuit and the at least one current generating circuit are the same at least one dual-purpose circuit, wherein the current results in the first and second AC mixing magnetic fields.

5. The magnetic field sensor of claim 1, wherein the at least one magnetic field generating circuit comprises:
    a first magnetic field source disposed proximate to the first magnetoresistance element; and
    a second magnetic field source disposed proximate to the second magnetoresistance element, wherein the first magnetic field source is configured to generate the first AC mixing magnetic field proximate to the first magnetoresistance element and the second magnetic field source is configured to generate the second AC mixing magnetic field proximate to the second magnetoresistance element.

6. The magnetic field sensor of claim 5, wherein the first and second magnetoresistance elements are disposed upon a substrate, and wherein the first magnetic field source comprises a first current conductor disposed upon or within the substrate and the second magnetic field source comprises a second current conductor disposed upon or within the substrate.

7. The magnetic field sensor of claim 6, wherein the first and second current conductors are electrically coupled in series with each other.

8. The magnetic field sensor of claim 6, wherein the first and second current conductors are electrically coupled in series with the first and second magnetoresistance elements.

9. The magnetic field sensor of claim 1, wherein the first and second AC mixing magnetic fields have directions within about +/−forty-five degrees of parallel to first and second major response axes of the first and second magnetoresistance elements, respectively.

10. The magnetic field sensor of claim 1, further comprising:
    a third magnetoresistance element having a first node and a second node; and
    a fourth magnetoresistance element having a first node and a second node, the second node of the third magnetoresistance element coupled to the first node of the fourth magnetoresistance element forming a second junction node coupling the third magnetoresistance element and the fourth magnetoresistance element in series,
    wherein a second portion of the AC mixing current is coupled to pass through the third and fourth series coupled resistors, and
    wherein the at least one magnetic field generating circuit is further operable to generate a third AC mixing magnetic field proximate to the third magnetoresistance element and operable to generate a fourth AC mixing magnetic field proximate to the fourth magnetoresistance element, wherein the third AC mixing magnetic field has a third AC magnetic field component with an AC magnetic field frequency the same as the AC current frequency, wherein the fourth AC mixing magnetic field has a fourth AC magnetic field component with the AC magnetic field frequency, wherein the first, second, third, and fourth AC mixing magnetic fields result in a differential output signal appearing at the first and second junction nodes, wherein the differential output signal comprises a DC component that changes value in response to changes of the sensed external magnetic field.

11. A method of sensing a sensed external magnetic field, the method comprising:
providing a first magnetoresistance element having a first node and a second node;
providing a second magnetoresistance element having a first node and a second node, the second node of the first magnetoresistance element coupled to the first node of the second magnetoresistance element forming a first junction node coupling the first magnetoresistance element and the second magnetoresistance element in series:
generating an AC mixing current, wherein at least a first portion of the AC mixing current is coupled to pass through the first and second series coupled magnetoresistance elements, wherein the AC mixing current has an AC current component with an AC current frequency; and
generating a first AC mixing magnetic field proximate to the first magnetoresistance element and generating a second AC mixing magnetic field proximate to the second magnetoresistance element, wherein the first AC mixing magnetic field has an AC magnetic field component with an AC magnetic field frequency the same as the AC current frequency, wherein the second AC mixing magnetic field has a second AC magnetic field component with the AC magnetic field frequency, wherein the first and second AC mixing magnetic fields result in an output signal appearing at the first junction node, wherein the output signal comprises a DC component.

12. The method of claim 11, further comprising:
comparing a signal representative of the output signal with at least one threshold signal to generate a comparison signal having a first state indicative of a magnitude of the sensed external magnetic field being less than a first predetermined magnetic field magnitude and having a second state indicative of the magnitude of the sensed external magnetic field being greater than a selected one of the first predetermined magnetic field magnitude or a second different predetermined magnetic field magnitude.

13. The method of claim 12, further comprising:
filtering to remove an AC component of the output signal at the AC magnetic field frequency.

14. The method of claim 11, wherein the at least the first portion of the AC mixing current results in the first and second AC mixing magnetic fields.

15. The method of claim 11, wherein the first and second magnetoresistance elements are disposed upon a substrate, wherein the generating the first AC mixing magnetic field comprises:

generating the first AC mixing magnetic field proximate to the first magnetoresistance element with a first current conductor disposed upon or within the substrate, wherein the generating the second AC mixing magnetic field comprises:
generating the second AC mixing magnetic field proximate to the second magnetoresistance element with a second current conductor disposed upon or within the substrate.

16. The method of claim 15, wherein the first and second current conductors are electrically coupled in series with each other.

17. The method of claim 1, wherein the first and second current conductors are electrically coupled in series with the first and second magnetoresistance elements.

18. The method of claim 11, wherein the first and second AC mixing magnetic fields have directions within about +/−forty-five degrees of parallel to first and second major response axes of the first and second magnetoresistance elements, respectively.

19. The method of claim 1, further comprising:
providing a third magnetoresistance element having a first node and a second node; and
providing a fourth magnetoresistance element having a first node and a second node, the second node of the third magnetoresistance element coupled to the first node of the fourth magnetoresistance element forming a second junction node coupling the third magnetoresistance element and the fourth magnetoresistance element in series;
wherein a second portion of the AC mixing current is coupled to pass through the third and fourth series coupled resistors, and
wherein the at least one magnetic field generating circuit is further operable to generate a third AC mixing magnetic field proximate to the third magnetoresistance element and operable to generate a fourth AC mixing magnetic field proximate to the fourth magnetoresistance element, wherein the third AC mixing magnetic field has a third AC magnetic field component with an AC magnetic field frequency the same as the AC current frequency, wherein the fourth AC mixing magnetic field has a fourth AC magnetic field component with the AC magnetic field frequency, wherein the first, second, third, and fourth AC mixing magnetic fields result in a differential output signal appearing at the first and second junction nodes, wherein the differential output signal comprises a DC component that changes value in response to changes of the sensed external magnetic field.

* * * * *

UNITED STATES PATENT AND TRADEMARK OFFICE
CERTIFICATE OF CORRECTION

PATENT NO. : 10,078,117 B2
APPLICATION NO. : 14/870834
DATED : September 18, 2018
INVENTOR(S) : Gerardo A. Monreal et al.

Page 1 of 2

It is certified that error appears in the above-identified patent and that said Letters Patent is hereby corrected as shown below:

On the Title Page

Item (71), delete "Worcester, MA" and replace with --Manchester, NH--.

In the Specification

Column 6, Line 47, delete "and" and replace with --an--.

Column 6, Line 50, delete "as" and replace with --is--.

Column 7, Line 1, delete "a 104$a$," and replace with --at a point 104$a$,--.

Column 7, Line 65, delete "ft" and replace with --f,--.

Column 8, Line 23, delete "a" and replace with --α--.

Column 10, Line 61, delete "502 504" and replace with --502, 504--.

Column 11, Line 60, delete "602 604" and replace with --602, 604--.

Column 11, Line 61, delete "magneto resistance element" and replace with --magnetoresistance elements--.

Column 12, Line 29, delete "622." and replace with --622).--.

Column 12, Line 50, delete "of the resulting" and replace with --resulting--.

Column 13, Line 28, delete "9," and replace with --9B,--.

Signed and Sealed this
Fourth Day of June, 2019

Andrei Iancu
*Director of the United States Patent and Trademark Office*

CERTIFICATE OF CORRECTION (continued)
U.S. Pat. No. 10,078,117 B2

Column 13, Line 31, delete "sale" and replace with --scale--.

Column 13, Line 37, delete "and" and replace with --an--.

Column 13, Line 47, delete "and" and replace with --an--.

Column 15, Line 61, delete "operates" and replace with --operate--.

Column 15, Line 63, delete "cock" and replace with --clock--.

Column 21, Line 9, delete "need" and replace with --needed--.

Column 21, Line 20, delete "AR" and replace with --$\Delta$R--.

Column 22, Line 5, delete "AR" and replace with --$\Delta$R--.

Column 22, Line 18, delete "signal." and replace with --signal--.

Column 22, Line 27, delete "FIG." and replace with --FIGS.--.

Column 22, Line 41, delete "180" and replace with --1800--.